(12) United States Patent
Rohleder et al.

(10) Patent No.: US 11,791,806 B2
(45) Date of Patent: Oct. 17, 2023

(54) SYSTEMS AND METHODS FOR PULSE WIDTH MODULATION SHAPING

(71) Applicant: NXP USA, Inc., Austin, TX (US)

(72) Inventors: Michael Rohleder, Bayern (DE); Vaclav Halbich, Austin, TX (US); Lukas Vaculik, Valasske Mezirici (CZ); Petr Špaček, Ostrava-Stará Bělá (CZ)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 18/045,835

(22) Filed: Oct. 12, 2022

(65) Prior Publication Data

US 2023/0111644 A1 Apr. 13, 2023

Related U.S. Application Data

(63) Continuation of application No. 17/188,801, filed on Mar. 1, 2021, now Pat. No. 11,595,027.

(30) Foreign Application Priority Data

Oct. 20, 2021 (EP) .................................... 21203643

(51) Int. Cl.
*H03K 3/017* (2006.01)
*H02J 7/02* (2016.01)
(Continued)

(52) U.S. Cl.
CPC ................ *H03K 3/017* (2013.01); *H02J 7/02* (2013.01); *H03K 3/037* (2013.01); *H03K 19/20* (2013.01); *H02J 50/10* (2016.02)

(58) Field of Classification Search
CPC ......... H03K 3/017; H03K 3/037; H03K 19/20
See application file for complete search history.

(56) References Cited

U.S. PATENT DOCUMENTS 5,812,427 A 9/1998 Nonoyama et al.
6,111,440 A * 8/2000 Rajagopalan ............ H03K 4/50
327/134
(Continued)

FOREIGN PATENT DOCUMENTS

WO WO2010036980 A1 4/2010

OTHER PUBLICATIONS

Gao, Xiang, "Demodulating Communication Signals of Qi-Compliant Low-Power Wireless Charger Using MC56F8006 DSC," Freescale Semiconductor Inc., Application Note, Document No. AN4701, Rev. 0, 21 pages, Mar. 2013.
(Continued)

*Primary Examiner* — Sibin Chen

(57) ABSTRACT

A system and method is disclosed, to generate an AC signal having a positive and negative half-cycles, each comprising a plurality of PWM pulses each with an individually designated pulse width, the system comprising: a first clock circuit; a second, faster, clock circuit; clock ratio measurement circuitry configured to output a first measurement being a ratio of frequencies; a propagation delay circuit configured to measure a number of propagation elements through which a bit transition propagates within a second clock signal period; pulse data calculation element configured to determine pulse shaping data; and for each of the half-cycles, a respective pulse synthesis circuit configured to synthesise the respective plurality of PWM pulses, each pulse having a respective start defined by the first clock signal, and a pulse width defined by the pulse shaping data and synthesised from the second clock and an output pulse from the propagation delay circuit.

15 Claims, 11 Drawing Sheets

(51) Int. Cl.
   *H03K 3/037* (2006.01)
   *H03K 19/20* (2006.01)
   *H02J 50/10* (2016.01)

(56) References Cited

U.S. PATENT DOCUMENTS

| | | | |
|---|---|---|---|
| 6,421,382 B1 | 7/2002 | Hayakawa | |
| 6,436,299 B1 | 8/2002 | Baarman et al. | |
| 6,526,094 B1 | 2/2003 | Watanabe | |
| 6,534,960 B1* | 3/2003 | Wells | H02M 3/1584 |
| | | | 323/284 |
| 7,079,577 B2 | 7/2006 | Cohen | |
| 8,185,064 B2 | 5/2012 | Nogami et al. | |
| 8,315,302 B2 | 11/2012 | Lewis | |
| 8,873,616 B2 | 10/2014 | Garbutt et al. | |
| 11,108,324 B1 | 8/2021 | Vaculik et al. | |
| 2002/0136290 A1 | 9/2002 | Houghton | |
| 2011/0199164 A1* | 8/2011 | Lukic | H03K 7/08 |
| | | | 332/109 |
| 2012/0011088 A1 | 1/2012 | Aparin et al. | |
| 2012/0207205 A1* | 8/2012 | Zhao | G09G 3/3406 |
| | | | 375/238 |
| 2015/0171843 A1 | 6/2015 | Kim | |
| 2015/0270777 A1* | 9/2015 | Cowley | H02M 3/158 |
| | | | 323/271 |
| 2016/0111061 A1 | 4/2016 | Thenus et al. | |
| 2019/0123725 A1 | 4/2019 | Vulpoiu et al. | |
| 2019/0305596 A1 | 10/2019 | Mantha et al. | |

OTHER PUBLICATIONS

WCT1011DS Data Sheet, Freescale Semiconductor Inc., Document No. WCTI0IIDS, Rev. 0, 45 pages, Sep. 2016.

Wu, Charlie, "Overview of Wireless Power and Data Communication," Freescale Semiconductor Inc., Wireless Power Consortium, 21 pages, downloaded from www.wirelesspowerconsortium.com on Jan. 12, 2021.

U.S. Appl. No. 17/658,348 "Improved Multiple and Sinusoidal Pulse Width Modulation for Wireless Charging" filed Apr. 7, 2022.

U.S. Appl. No. 17/188,801 "High Frequency Pulse Width Modulation Shaping" filed Mar. 1, 2021.

Notice of Allowance for U.S. Appl. No. 17/188,801 dated Jun. 20, 2022.

Notice of Allowance for U.S. Appl. No. 17/188,801 dated Oct. 5, 2022.

\* cited by examiner

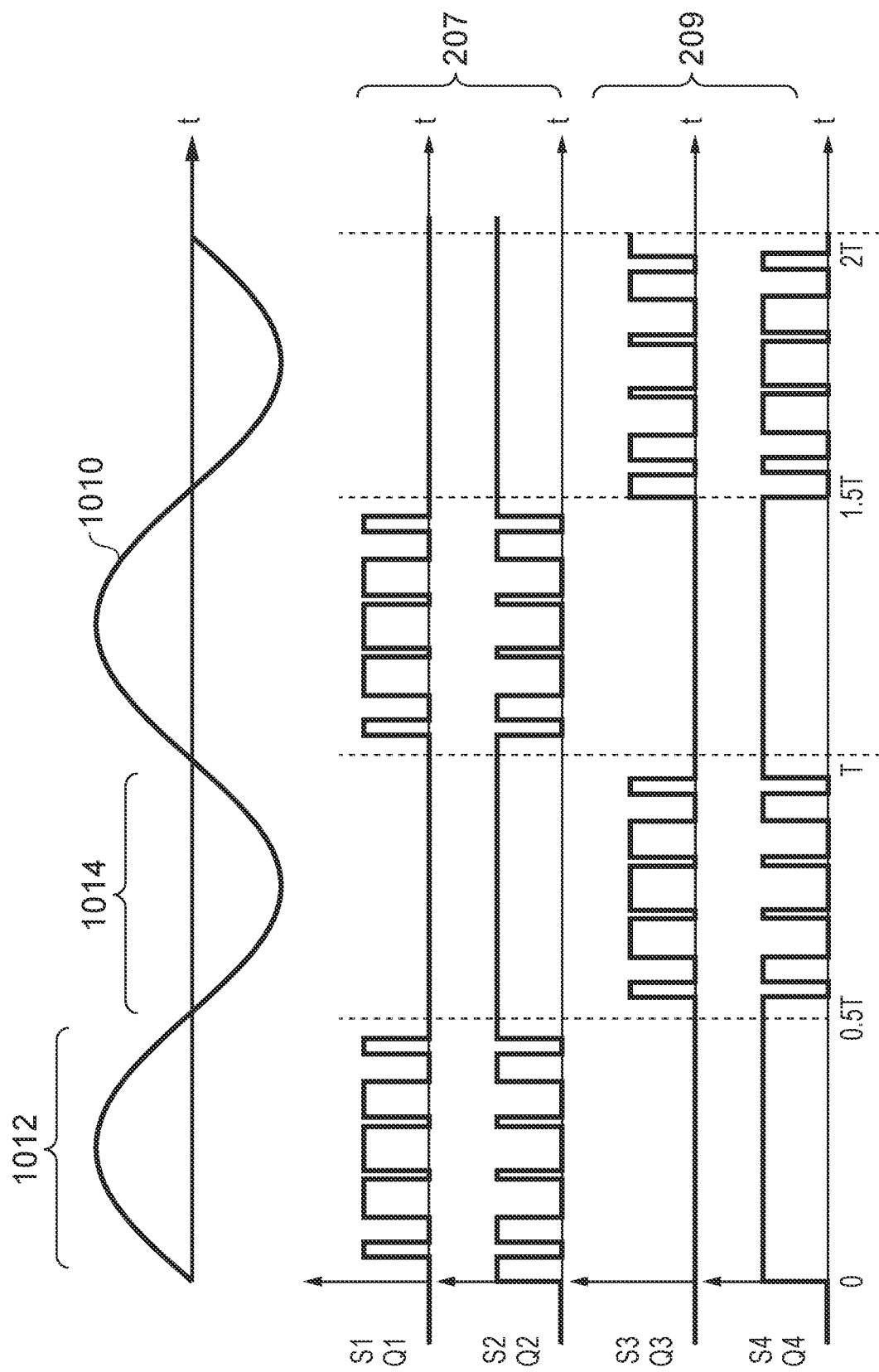

SYSTEMS AND METHODS FOR PULSE WIDTH MODULATION SHAPING

CROSS REFERENCE TO RELATED APPLICATIONS

This application claims, in part, priority under 35 U.S.C. § 119 of European Patent Application No. 21203643.8, filed on Oct. 20, 2021, the contents of which are incorporated herein by reference.

This application claims, in part, priority under 35 U.S.C. § 120 of U.S. patent application Ser. No. 17/188,801, filed on Mar. 1, 2021, the contents of which are incorporated herein by reference.

FIELD

The present disclosure relates to systems and methods for generating an AC signal by pulse width modulation (PWM), and in particular—but not exclusively, by triangular PWM (T-PWM) for use in wireless charging applications.

BACKGROUND

Wireless power is becoming more and more popular today, through which a number of electronic items like mobiles, laptops, media players, can be charged without cords or wires. A central issue to be solved for wireless charging is the generation of the signal used for inductive charging, which must follow some of the related standards. As such this signal must not only transfer the wireless power, but also communicate with the device being charged.

Contemporary wireless-charging technology uses near-field charging ("NFC") in which a transmitting coil produces a magnetic field that transfers inductive energy to a nearby receiving coil. A fraction of the magnetic flux generated by the primary transmitter coil penetrates the secondary receiver coil and thus transfers power, i.e., the two coils essentially form a transformer. For example, in a typical wireless charging system, a wireless charging mat wirelessly transmits power to a portable electronic device that is placed on the mat. The portable electronic device has a coil and rectifier circuitry. The coil in the portable electronic device receives alternating-current wireless power signals from a coil in the wireless charging mat that is overlapped by the coil in the portable electronic device. The rectifier circuitry converts the received signals into direct-current power. The wireless power transmitting device has wireless power transmitting circuitry that includes a resonant circuit, an inverter for driving the resonant circuit, and pulse width modulation ("PWM") signal generator that outputs a periodic control signal (a series of PWM pulses) to the inverter at a selected varying duty cycle.

Two of the competing NFC standards are the Qi ("Chee") standard controlled by the Wireless Power Consortium ("WPC"), which has an operating frequency of 100 to 200 kHz, while the AirFuel Alliance, formerly known as the Power Matters Alliance ("PMA"), supports AirFuel Inductive, operating at 100 to 350 kHz. Another standard by Apple, Inc. may operate at even higher frequencies in the future.

Thus, it is desirable that the hardware used for creating this signal (to adhere to existing or coming standards) incorporate the achievable accuracy of the signal being used, but also be implemented in a cost-effective manner.

Traditional implementations of PWM generation capabilities either utilize a very fast clock that can be used to generate the PWM pulses, or a set of delay elements that can be used to specify (a subset) of the required PWM pulse width. However, both implementations have severe limitations. Despite the lower clock speeds of the fundamental frequencies being used by the known standards, this will still require a very fast clock speed (e.g., in the >2 GHz frequency range) for the generation of sufficiently accurate PWM pulse widths. The usage of delay elements has different issues in that typical analog implementations must use a specific delay that will need to be trimmed to compensate for process variations, and may further exhibit a varying temperature and/or voltage dependency during operation. For example, assuming at least a 10-bit accuracy is required for sufficiently accurate PWM pulses in the 2 MHz frequency range, this would require delay elements having at least a 500 picosecond resolution, which will need to be maintained or must be adjusted over variations in temperature and/or voltage during operation.

Another further complexity is the need to be able to produce the PWM pulses in relation to a changing fundamental frequency of the AC signal that is used by the communication aspect of wireless charging. This is especially an issue when using delay elements that cannot scale with changes in the fundamental frequency, when this would be required.

Disclosed are systems and methods which may alleviate, reduce, or even eliminate some of the above concerns.

Moreover, a further aspect of generation of triangular PWM signals for use in the generation of an AC signal in such a system is the prevalence of spurious or unintentional zero crossings of the AC signal around the change from a positive-going half cycle to a negative-going half cycle. Such spurious zero crossings can typically result due to the relatively low power being transferred at the start of the AC cycle. Whereas measurements of the actual zero crossing at the intentional change is a convenient method of measuring the fundamental frequency, these measurements may be interrupted interfered with by spurious zero crossings.

Disclosed and claimed are systems and methods which may reduce, or even eliminate such spurious zero crossings.

SUMMARY

According to a first aspect of the present invention, there is provided a system configured to generate a pulse width modulated, PWM, AC signal having a positive half-cycle and a negative half-cycle, each comprising a plurality of PWM pulses each with an individually designated pulse width, the system comprising: a first clock circuit configured to provide a first clock signal having a first frequency; a second clock circuit configured to generate a second clock signal having a second frequency, wherein the second frequency is greater than the first frequency; clock ratio measurement circuitry configured to output a first measurement for determining a ratio of the second frequency to the first frequency; a propagation delay circuit comprising a plurality of propagation delay elements and configured to output a second measurement indicative of a number of propagation elements through which a bit transition propagates within a single cycle of the second clock signal; pulse data calculation element or software block configured to determine pulse shaping data from the first and second measurements and the individually designated pulse widths; for each of the positive half-cycle and the negative half-cycle, a respective pulse synthesis circuit configured to synthesise the respective plurality of PWM pulses, each pulse of each of the plurality of PWM pulses having a respective start defined by the first clock signal, and a respective pulse width defined by the shaping data and synthesised from the second clock signal and a respective output pulse from the propagation delay circuit. Providing separate synthesis circuits for each of the positive and negative half cycles of the AC signal allows for independent control of the PWM pulses in each of the two half cycles while maintaining a common time base defined by the second clock, which may mitigate, reduce or avoid a possible problem of spurious or other unintentional zero-crossings of the AC signal around the low voltage or low-currents part of the AC signal close to the actual zero-crossing. The ratio of the second frequency to the first frequency may be the first measurement, and determined directly by the clock ratio measurement circuit. Alternatively, it may be determined externally, particularly in the case that the measurement is made over more than one period of the PWM clock.

According to one or more embodiments, a start of the plurality of PWM pulses of at least one half-cycle is adjustable. In embodiments, a start of the plurality of PWM pulses of each half-cycle relative to the start of the positive half-cycle is programmable. Providing adjustability, or programmability, to the start of the plurality pulses of one or each half cycle allows for one half cycle to be offset relative to the other, which may thereby adjust the pulses close to the zero crossing, in order to avoid or eliminate spurious zero crossings. The adjustment may be delaying the plurality pit of pulses of the half cycle by one or more periods of the second clock.

According to one of more embodiments, the system further comprises a multiplex select signal which defines a start and an end of each half-cycle By decoupling the multiplexer select signal for the selection of, and in particular the start and end of each half-cycle from the generation of pulses for the two half-cycles, a corresponding independent control may be achieved.

According to one or more embodiments, the respective synthesis circuitry of at least one of the first and second half-cycle is configured such that the start of the plurality of PWM pulses of that half-cycle precedes the start of the respective half-cycle. By providing the PWM pulses of each half cycle to be independently synthesised allows extension of one or both of the series of PWM cycles pulses to extend prior to the start of the half cycle, which may thereby mitigate, reduce or eliminate spurious zero crossings related to the switching between half-cycles. According to one or more embodiments, the respective synthesis circuitry of at least one of the first and second half-cycle is configured such that of the plurality of PWM pulses of that half-cycle extends beyond an end of the respective half-cycle. This, similarly, may mitigate, reduce or eliminate spurious zero crossings.

According to one or more embodiments the respective synthesis circuit comprises respective pulse generation logic configured to synthesise the pulse width for each respective PWM pulse of the respective plurality of PWM pulses from a respective predetermined calculated number of cycles of the second clock, together with the respective output pulse from the propagation delay circuit. The same propagation delay circuit may thus be used by each of the synthesis circuits. Moreover, each of the synthesis circuits thereby operates using a common time-based provided by the second clock.

According to one or more embodiments, the propagation delay circuit is configured to generate the respective output pulse from the propagation delay circuit by bit transitions through a respective calculated number of the propagation delay elements. Generation of such a pulse, which may also be referred to as an intra-clock portion, or intra-clock pulse, may typically allow for improved accuracy of the width of the pulses, such as that corresponding to an extra 2 to 3 bit-accuracy over the accuracy possible with the internal clock frequency. (For example, if 9-10 bit accuracy is achievable with the ratio of internal clock to the reference clock, 10-12 bit accuracy may be achievable with the extra intra-clock portion.)

According to one or more embodiments, the propagation delay circuit further comprises an output tap control circuit configured to output the respective output pulse from the propagation delay circuit, and each respective synthesis circuit comprises a same plurality of propagation delay elements and the output tap control circuit. Reuse of just some of the same circuitry may avoid the cost overhead of requiring to replicate that circuitry, whilst retaining the independent control of each of the positive and negative half-cycles.

According to one or more embodiments, the pulse data calculation element, circuitry or software block is configured to calculate the respective calculated number of the propagation elements and the respective predetermined calculated number of cycles of the second clock, together required to synthesise the respective pulse width. This function may be provided entirely within software, or be a combination of software and hardware or hardware. It may be used to calculate the pulse width of the pulses in each AC half cycle, in each case in terms of the number of periods of the second clock in combination with a number of propagation elements to be set for bit transition in order to calculate the intra-clock portion.

According to one or more embodiments the system further comprises a pulse start logic circuit, connected to the first clock signal and configured to control the respective start of each pulse of each of the plurality of PWM pulses. Providing that the start of each PWM pulse is determined according to the first clock, which typically may be an accurate, but slow (relative to the second clock) clock, may provide for a particularly convenient and simple mechanism to change the fundamental frequency of the AC signal. In particular this may be put into effect by changing the frequency of the first clock, whilst retaining the same number of PWM pulses in each half cycle, and the same timing (in terms of number of first clock cycles) between the start of each PWM pulse.

According to one or more embodiments, the system further comprises a pulse start logic circuit, connected to the first clock signal and configured to control the respective start of each pulse of each of the plurality of PWM pulses. Since the pulse frequency or repetition rate corresponds to an integral number of cycles of the first clock, the pulse start logic may trigger the start of each pulse, simply by counting a predetermined number of (first) clock pulses, since the last pulse start.

According to one or more embodiments, the system further comprises a plurality of control registers configured to store the pulse shaping data for a group of pulses. This may be particularly convenient in applications or embodiments in which the control is split between two devices or two groups of circuits: in particular, a general-purpose microcontroller unit may be used for some of the functionality such as determination of the basic PWM clock, power controller and calculation of the required pulse shaping; conversely a dedicated device or group of circuits may be used for the propagation delay circuitry, and pulse synthesis. The second clock may be a free running or internal clock to the dedicated device or group of circuits. In such applications or embodiments, transferring pulse shaping data corresponding to multiple PWM pulses and storing them in control registers may provide for convenience, independent signal synthesis control and control data updates, and processor-efficiency. In one or more embodiments, the group of pulses consists of each of the pulses of a one of the respective plurality of PWM pulses for a complete half-cycle of the AC signal.

According to one or more embodiments, the system further comprises a finite state machine, and a select signal configured to, under control of the finite state machine, select a respective pulse generation logic for each of the positive half-cycle and the negative half-cycle.

Such a finite state machine may be useful to control the pulse synthesis circuitry and in particular pulse generation logic and to ensure correct pulse shaping data is supplied from the control registers to the pulse generation logic. Moreover the finite state machine may be used in conjunction with a multiplexer select signal to ensure that the propagation delay circuit is connected to the appropriate synthesis circuit and in particular the appropriate pulse generation logic for the current half cycle of the AC signal.

According to one or more embodiments the clock ratio measurement circuitry is configured to count an integer number of second clock periods over a predetermined second integer number of first clock periods and the ratio is the first integer number divided by the second integer number. In the simplest case, when a single clock period of the first clock is used, this corresponds to simple integer arithmetic (ie no division is required), and the counting, is all that is needed. A more accurate ratio may be provided by measuring across a plurality of first clock periods—for example it may be possible to reduce potential offset errors caused by slew rate, or other measurement artifacts or uncertainties. The ratio may be calculated in the clock radio measurement circuit, or elsewhere, in particular in the in the PWM Clock and Data Generation element, for instance by software.

According to one or more embodiments the first clock circuit is further configured to adjust the first frequency in response to a data-transfer request. Adjusting the first frequency allows for simple adjustments of the fundamental frequency of the AC signal. This may be utilised, as will be familiar to the skilled person, in frequency shift keying (FSK) for the communication of data, for instance following one or more well-known protocols for encoding of the data by FSK.

According to one or more embodiments the first clock circuit is configured to generate the first clock signal. In other embodiments, the first clock may be a system clock, or otherwise generated outside of the circuit, and provided to the first clock circuit for use as the first clock signal According to one or more embodiments the PWM AC signal is a triangular modulated AC signal.

According to a second aspect of the present invention, there is provided a method of generating a pulse width modulated, PWM AC signal, having a positive half-cycle and a negative half-cycle, each having a respective start-moment and comprising a plurality of PWM pulses each having a respective individually designated pulse width, the method comprising: for each of the positive half-cycle and the negative half-cycle each: determining a pulse width for a specified PWM pulse to be generated; determining a first measurement of a ratio between a PWM clock signal and a second clock signal; configuring a bit transition to propagate through a propagation delay circuit and determining a second measurement of a number of propagation delay elements through which the bit transition propagates within a single cycle of the second clock signal; determining pulse shaping data comprising a first number cycles of the second clock signal and a second number of the propagation delay elements to be utilised together to produce the pulse width for the specified PWM pulse as a function of the first measurement and the second measurement; and utilising the determined first number of cycles of the second clock signal and the determined second number of the propagation delay elements to synthesise the specified PWM pulse; the method further comprising providing a timing offset between a start of a first PWM pulse in the positive half-cycle relative to its start-moment, and timing offset between a start of a first PWM pulse in the negative half-cycle relative to its start-moment. It will be appreciated that in the case that a calculation is involved to determine the ratio between a PWM clock signal and a second clock signal (i.e. when the measurement is made over more than one PWM clock cycle), this calculation may be made in the PWM Clock and Data Generation element 201 or the PWM pulse synthesis unit 202.

According to one or more embodiments, the method further comprises the first clock circuit adjusting the first frequency in response to a data-transfer request. According to one or more embodiments, for each of the positive half-cycle and the negative half cycle, the determined first number of cycles of the second clock signal and the determined second number propagation delay elements are used in a respective pulse generation logic circuit to synthesise the specified PWM pulse. According to one or more embodiments, the timing offset is an integral number of cycles of the second clock signal.

These and other aspects of the invention will be apparent from, and elucidated with reference to, the embodiments described hereinafter.

BRIEF DESCRIPTION OF DRAWINGS

Embodiments will be described, by way of example only, with reference to the drawings, in which

FIG. 10 illustrates signals required to be supplied to the drivers for controlling switches or FETs of a DC-AC inverter, in order to generate the AC;

Figure 1:
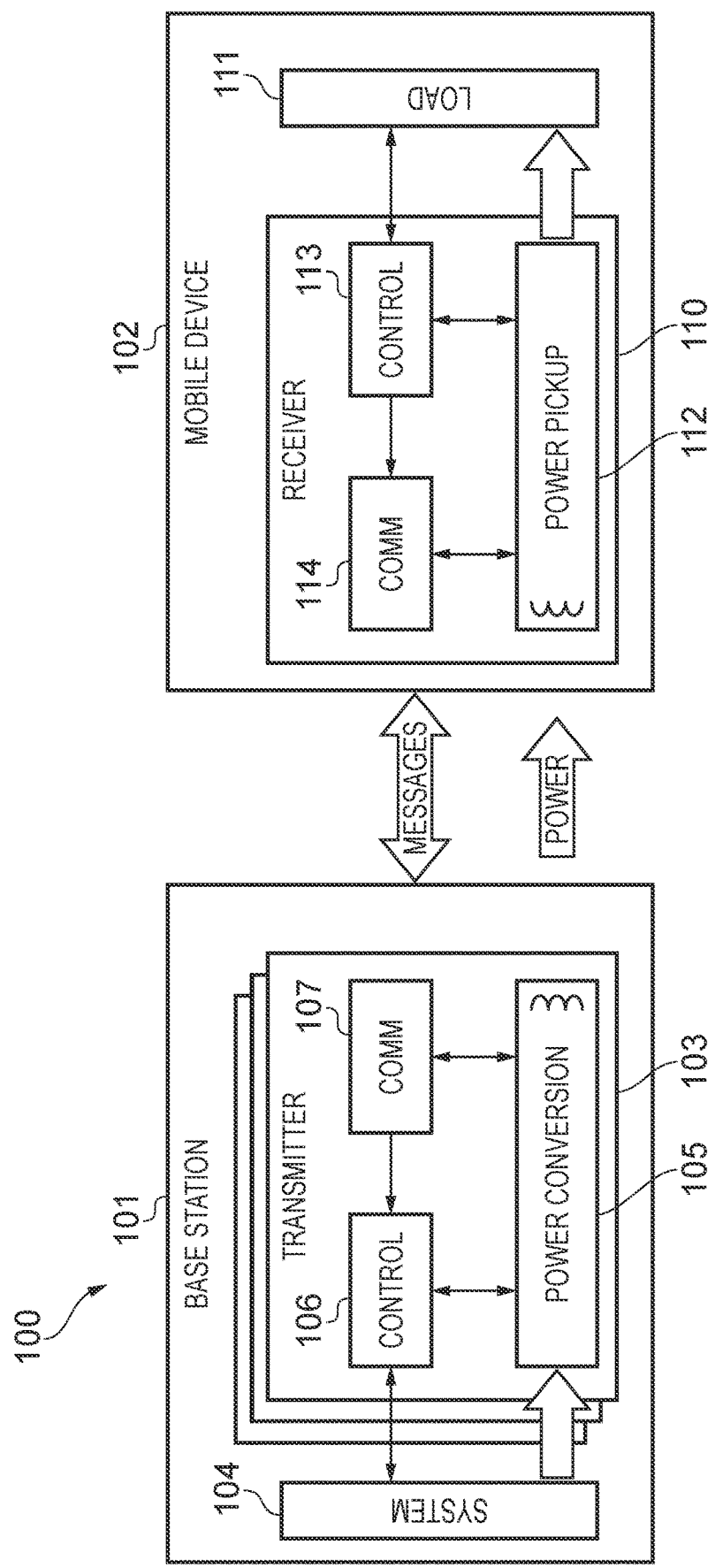
FIG. 1 illustrates an exemplary block diagram of wireless charging of a mobile device.

It should be noted that the figures are diagrammatic and not drawn to scale. Relative dimensions and proportions of parts of these figures have been shown exaggerated or reduced in size, for the sake of clarity and convenience in the drawings. The same reference signs are generally used to refer to corresponding or similar features in modified and different embodiments

DETAILED DESCRIPTION OF EMBODIMENTS

Referring to FIG. 1, there is illustrated a non-limiting example of a system 100 configured for wireless charging of a mobile device 102 by a wireless charging transmitter 103 implemented within a wireless charging base station 101, being an example of an application to which the present disclosure relates. Certain well-known system and circuit elements are not shown for the sake of simplicity. The base station 101 may include one or more wireless charging transmitters 103 for the wireless charging of more than one device. Embodiments of the present disclosure are not limited to the wireless charging of a mobile device such as a mobile phone, but are applicable to the wireless charging of other devices. Each of the one or more wireless charging transmitters 103 may be powered by an input direct current ("DC") rail (e.g., 5 V to 19 V), which may be derived from a USB port or an AC/DC power adapter.

Each of the wireless charging transmitters 103 in the base station 101 may be controlled by system circuitry 104, which may be implemented as a microcontroller or some other processing circuitry appropriate for control and operation of such a wireless charging base station 101. Each wireless charging transmitter 103 may include a power conversion circuit or power conversion circuitry 105, which may include appropriate circuitry such as a multiplexer, a full half bridge, etc. for producing an alternating current ("AC") signal from PWM pulses having variable pulse widths (and thus variable duty cycles) the AC signal having a designated (fundamental) frequency, which frequency may be modified in order to send messages between the transmitter 103 and a receiver 110 of the device 102 being wirelessly charged. The power conversion circuitry 105 may be implemented with a switched transistor bridge using four field effect transistors ("FETs") to drive a coil, typically with a series capacitor. A resonant frequency is set internally. The power conversion circuitry 105 typically has a coil to transfer power to the mobile device 102 by electromagnetic induction. The power conversion circuitry 105 may support multi-coil arrays, driven by separate bridges, which are automatically selected to deliver the highest coupled power into the wireless charging receiver 110.

Each transmitter 103 may also include control circuitry 106 configured for producing the PWM pulses with the variable pulse widths. The communication circuitry 107 of the transmitter 103 and the communication circuitry 114 of the receiver 110 may be configured in a well-known manner (sometimes referred to as frequency shift keying, FSK) for communicating messages between the transmitter 103 and the receiver 110 by altering the fundamental frequency of the charging AC signal and the responses of the load 111 (note that the double-headed Messages arrow in FIG. 1 is merely a representation of the communication of such messages; a communication channel separate from the charging AC signal is not implemented).

The device 102 being wirelessly charged includes a wireless charging receiver 110, which includes power pickup circuitry 112 for receiving the wireless charging signal from the transmitter 103 and converting it into DC power for charging of a load 111 (e.g., a rechargeable battery or fuel cell). The power pickup circuitry 112 may also include circuitry configured to extract messaging sent from the transmitter 103, which is processed by the communication circuitry 114. The wireless charging receiver 110 may also include control circuitry 113 configured for controlling the power pickup circuitry 112, monitoring of the charging process, and the producing of messaging within the wireless charging receiver 110, which may be communicated to the wireless charging transmitter 103 via responses of the load 111 to the charging AC signal for assisting in its control of the signals being utilized in the wireless charging of the device 102.

The induced power is coupled to the wireless charging receiver 110, which has a similar coil as the transmitter 103 in the power pickup circuitry 112 to collect the incoming power. The power pickup circuitry 112 may rectify the received power by way of diode rectifiers (e.g., utilizing FETs). The power pickup circuitry 112 may also filter the power using ceramic output capacitors, and then apply it to the load 111 that needs to be charged (e.g., either through a linear stage or a switching regulator).

The load 111 inside the mobile device 102 receives the power and charges up. The receiver 110 may be configured to send messages to the transmitter 103 to adjust the charging current or voltage, and also to stop transmitting power completely when end of charge is indicated.

In operation, the receiver 110 may send messages to the transmitter 103 to provide control and device information to the transmitter 103 by load modulation on the received charging signal. The communication circuitry 114 in the receiver 110 may receive messages from the transmitter 103 by demodulation of the frequency modulation on the received power signal. The transmitter 103 may receive messaging from the receiver 110 with respect to power control and device information from the receiver 110 by demodulation of the load modulation. The transmitter 103 may send information regarding the transmitter 103 and/or networking messages to the receiver 110 by frequency modulation on the power signal delivered to the mobile device 102. Such modulation may be implemented with any well-known modulation.

Messaging between the transmitter 103 and the receiver 110 may take the form of any well-known data messaging.

Figure 2:
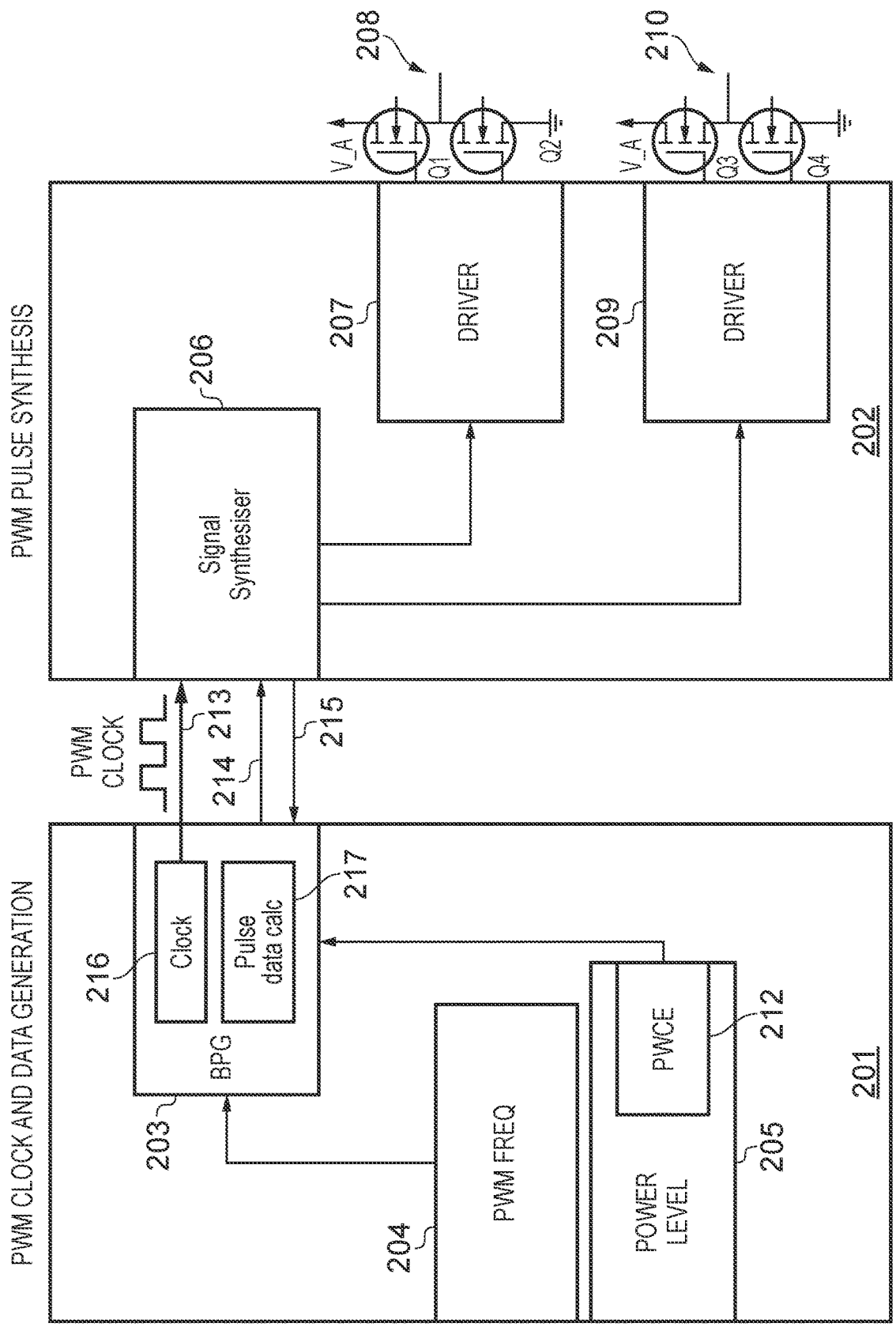
FIG. 2 illustrates a simplified block diagram of system for the generation an AC signal for use in a wireless charging arrangements such as that of FIG. 1.

FIG. 2 illustrates a PWM Clock and Data Generation element 201 coupled to a PWM pulse synthesis unit 202, whereby the PWM Clock and Data Generation element 201 and the PWM pulse synthesis unit 202 are implemented within the wireless charging base station 101. The PWM Clock and Data Generation element 201 may be implemented by software within a conventional microprocessor unit; the PWM pulse synthesis unit 202 may be implemented in hardware.

The PWM Clock and Data Generation element 201 includes a block labelled as basic PWM clock generation ("BPG") block 203. This block has several functions: firstly, it includes a clock generation element 216, which may be any well-known clock signal generation circuit, to generate a clock signal, described herein as the PWM clock signal 213. The PWM clock signal 213 may be directly synthesised within the BPG block 203, or may be generated by modifying or adapting an externally provided clock. Such an externally provided clock may be, for instance, a system clock of a microprocessor unit in which the PWM Clock and Data Generation Unit is comprised. The frequency of the PWM clock signal 213 is specified by a PWM frequency block 204. As mentioned above, in applications such as wireless charging, communication may be provided from the transmitter (power supply) to the receiver (device being charged) by FSK: that is to say, by altering the fundamental frequency of the AC charging signal. Since the AC signal frequency depends on the PWM clock signal 213, a particularly convenient method of implementing FSK is thus by changing the frequency of the PWM clock signal 213.

In conventional systems the BPG block 203 is configured to generate a series of PWM pulses for the generation of the AC signal, using, as a time-base for this generation the PWM clock signal 213. In contrast, according to the present disclosure, the PWM clock signal is used only to determine the repetition rate of the PWM pulses. Besides that, the PWM clock signal 213 is not used for the generation of the PWM pulses themselves. Instead, a second clock signal, 312, is used for coarse control, together with a group of propagation elements to allow for fine control. These will be described in more detail with reference to FIG. 3.

The second clock signal 312, and the propagation elements, are, in effect, calibrated by being compared with the PWM clock signal 213. Note that no adjustments, or corrections, to the second clock or propagation elements are made. Using a first measurement and a second measurement, the speed of this second clock 312 (which may vary slowly over time due to for instance temperature or voltage variation), and a propagation rate associated with propagation elements, can be determined, in terms of the PWM clock speed. This is typically done by the BPG block 203 using first and a second measurements which are transferred to it as shown at 215. This constitutes a second function of the BPG block 203.

A third function of the BPG block 203 is to provide an indication to the PWM pulse synthesis unit 202 of the pulses, and in particular of the pulse widths, to be used by PWM pulse synthesis unit 202 to synthesise the PWM pulses in order to generate the AC signal. This is done in a pulse data calculation element 217 (also referred to as pulse data calculation circuitry or pulse data calculation software block. The power required to be transferred (momentarily, or integrated over the AC signal) is determined in power level block 205. Power level block 205 also determines the necessary pulse widths of each of the PWM pulses required to achieve that level of power transfer. This is carried out in a pulse width calculation element (PCWE) 212. It should be noted that in the PWCE the pulse width is typically determined as a binary value (for instance it may be a 32-bit value), referenced against a corresponding binary value for the pulse repetition rate (which is defined by the PWM frequency unit 204). The ratio of the two values thus corresponds to the required duty cycle for each pulse. The pulse width requirement for each of the PWM pulses is provided by the power level unit or block 205 to the BPG block 203. The BPG block 203 translates, or converts, this requirement (for each PWM pulse), into a pair of values corresponding to the required pulse width, usable by the PWM pulse synthesis unit 202. The pair of values are the "cycles of the second clock" and "number of propagation elements". This data (for a group of pulses), is provided to the PWM pulse synthesis unit 202 as "pulse shaping" data, or a set of pulse data 214. Thus, as will be described with respect to FIG. 9, the software executed within the BPG block 203 is configured to calculate the corresponding PWM shaping information as a function of measurements to be made within the PWM pulse synthesis unit 202, for designating each pulse width of the PWM pulses to be generated. The result of these calculations is then delivered to the PWM pulse synthesis element 202 in a well-known manner. The "shaping calc" unit 217 may alternatively be described as a "pulse data calculation unit".

The PWM pulse synthesis unit 202 includes a signal synthesiser 206. As will be further described, the signal synthesiser 206 implements a second clock signal (which may be internally generated within the signal synthesiser 206 as a free-running clock signal, or otherwise provided), performs measurements pertaining to this second clock signal, generates or synthesises a series of PWM pulses having individual pulse widths, and forwards these PWM pulses to the driver elements 207, 209, to control the FETs Q1, Q2, Q3 and Q4 operating the power conversion circuit 105, also referred to herein as an inverter, for AC signal generation. In accordance with embodiments of the present disclosure, this second, or internally generated, clock signal may be generated in a manner that is independent from the generation of the PWM clock signal 213, i.e. neither of these clock signals is derived from the other clock signal.

As will be described in further detail, the measurements pertaining to the second clock signal (also referred to herein as the "internal clock," "internal clock signal," or "internally generated clock signal") are delivered to the software running within the BPG block 203, and in particular to the pulse data calculation element 217. to produce the PWM shaping information using the result of power level calculations in power level block 205, and in particular the results of a pulse width calculation element (PWCE) 212, within the power unit 205, which designates the pulse widths for each PWM pulse to be generated or synthesised within the signal synthesiser 206.

One of these measurements calculates, typically in a continuous or dynamic manner, a ratio of the number of cycles of the internal clock signal to one or more cycles of the PWM clock signal produced by the clock signal generation circuit in the BPG block 203 (this measurement is also referred to herein as the "first measurement", and the measurement result as a "first measured parameter").

The software within the pulse data calculation element 217 part of the BPG block 203 uses this clock ratio measurement to determine, or designate, how many cycles of the internal clock signal are required to generate a required pulse width for each of the PWM pulses. This may also be referred to herein as the "inter-clock portion" of the respective pulse width. Since an integer number of cycles of the internal clock signal may not be sufficiently accurate to precisely produce, or designate, the pulse width of a particular PWM pulse to be generated (for instance, when the particular required pulse has a width (as measured in time) that is not exactly equal to an integer number of cycles of the internal clock signal), another measurement (also referred to herein as the "second measurement", and the result as a "second measured parameter") is utilized to determine a fraction (less than one) of a cycle of the internal clock signal which should be concatenated to the inter-clock portion, to more accurately generate the pulse width of the particular PWM pulse to be generated. This fractional portion may also be referred to herein as the "intra-clock portion" of the pulse width. As will be further described with respect to FIG. 5, the additional accuracy provided by this intra-clock portion is a function of the technology utilized to measure it.

Aspects of the present disclosure, and in particular various features defined and claimed in the set of claims appended hereto, may be most readily understood with reference to FIGS. 10 through 14 below. For the convenience of the reader, pulse shapes and signals will be considered first, in relation to FIGS. 10 to 13. Various circuitry, and methods associated with the present disclosure will then be discussed in relation to FIGS. 3 through 9. Finally, FIG. 14 will be described, which particularly clearly illustrates concepts, systems and or methods claimed herein.

Turning to FIG. 10, this shows signals S1, S2, S3 and S4 required to be supplied to the drivers 207, 209, for controlling the switches or FETs Q1, Q2, Q3 and Q4 of the power conversion circuit 105, which may also be called anr inverter, in order to generate the AC signal 1010 having fundamental frequency 1/T. The AC signal has a first half-cycle 1012, and a second half-cycle 1014 which may be, as shown, respectively positive-going and negative-going. The control signals are arranged in pairs, (S1 and S2), and (S3 and S4). Within each half cycle, the two control signals of one of the pairs each has a constant value, whilst the two signals of the other pair of control signals have a series of complimentary PWM pulses. The two signals within the pair of control signals having a constant value have complimentary values during that half cycle, for instance, during the half cycle for which S1 is low or open, (corresponding to FET Q1 being off) S2 is high or closed (corresponding to FET Q2 being on).

The generation of the PWM signals, within a half cycle, will be discussed in more detail hereinbelow.

According to embodiments of the present disclosure, one or more parts of the control and generation circuitry and/or software utilised to generate or synthesise the control signal S1 may be different from that or those used to generate the control circuitry S3.

It will be appreciated that to some extent the pulses for each of the switches shown in FIG. 10 are idealised. In particular it will be noted that the impedances of the passive components such as capacitors and inductors in the power conversion circuitry 105 interact such that the final AC signal may be significantly displaced relative to the variation in the width of the PWM pulses forming the switch control signals.

Figure 11:
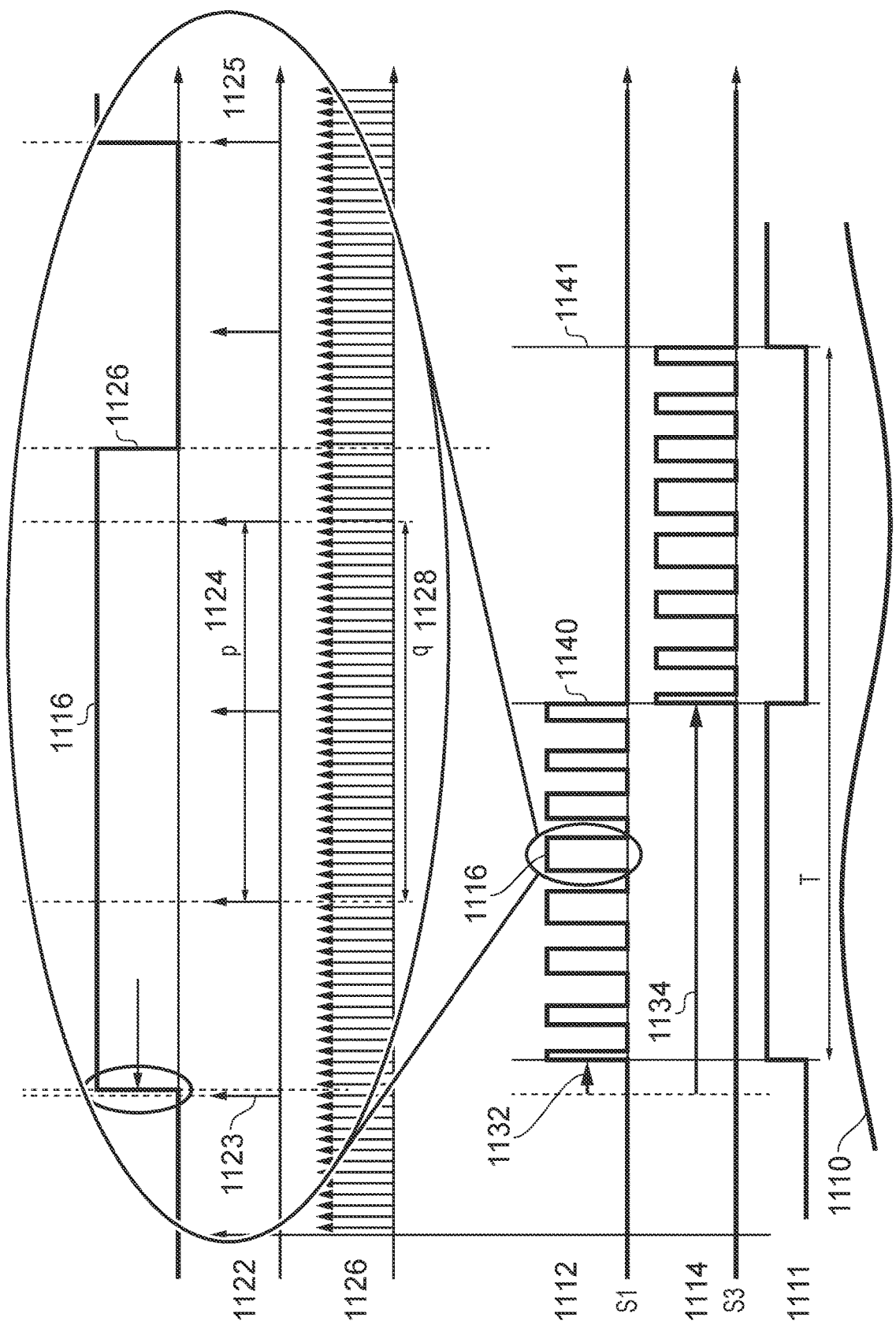
FIG. 11 shows schematically various signals and concepts of relevance to the present disclosure.

Turning now to FIG. 11, this shows schematically various signals and concepts of relevance to the present disclosure. Whilst the detailed implementations will be considered in more detail with respect to FIGS. 1 to 9, this figure may be of assistance in providing a basic understanding of the present disclosure.

The lower part of the figure shows, at 1110, a single period of the AC signal having a fundamental frequency 1/T, and at 1111 a corresponding multiplexer select signal. During a first half cycle of the AC signal, there is shown, at 1112, a series of PWM pulses labelled as S1 and controlling one of the switches of the power conversion circuit, and during a second half cycle of the AC signal, there is shown, at 1114, a series of pulses PWM pulses S3 labelled as and controlling one other of the switches.

The upper part of the figure shows an expanded view of one PWM pulse 1116 (which in this case corresponds to a pulse within the S1 series of PWM pulses within the first half cycle of the AC signal). Although not drawn directly to scale, the upper part of the figure has significantly larger-scale relative to the lower part of the figure. The upper part of the figure shows two clock signals 1122 and 1126. In order to avoid unnecessary obscuration in the figure, only the rising edge of each clock signal is shown (indicated by an upward pointing arrow). The first clock signal 1122 is the PWM clock signal, and the second clock signal 1126 is the internal, typically free running, clock which, as can be seen from the figure typically has a significantly higher clock frequency than the PWM clock.

The PWM clock is used to define the start, that is to say, the rising edge, but not the duration, that is to say, the pulse width of each of the PWM pulses, and in particular the PWM pulse 1116. Thus, as shown, the start of pulse 1116 is defined by the first rising edge of the internal clock that follows this rising edge, in this case, shown at 1123, of the PWM clock 1122, and the start of a subsequent pulse is defined by a subsequent rising edge 1125 of the PWM clock 1122 in a similar manner. Thus, it can be seen that in this particular, nonlimiting, example the frequency of the PWM clock 1122 is five times that of the PWM pulses.

The period T of the AC signal corresponds to an integral multiple of the period of the PWM pulse, and thus is also an integral multiple of the period of the PWM clock. It is desirable that the PWM be fast, but should be accurate. In some technologies, this may typically result in a PWM clock operating in a range of 4 to 40 MHz, but higher or lower speeds may also be possible. Thus, to consider again a nonlimiting example, each of the 2 half cycles of the AC signal may include 8 PWM pulses (and may typically be within a range of 3 to 15, although may be higher or lower), and the repetition rate of the PWM pulses may be every 15 PWM clock rising edges (and may typically be within a range of 8 to 32, but again, may be higher or lower). In this example, the PWM repetition clock is running at a frequency which is 15×8×2 i.e. 120 times that of the fundamental frequency 1/T of the AC signal.

Whereas the frequency, that is to say the repetition rate, of the PWM pulses is defined by the PWM clock, as already mentioned the duration or pulse width and thus the end, or falling edge, of each PWM pulse is not determined by the PWM clock. Instead, an end of each PWM pulse is determined according to the free running clock. However, use of this clock alone may not provide sufficient accuracy for the pulse width, and thus a second control part, based on a propagation delay circuitry 320, which will be described in more detail hereinbelow, is used in combination with the internal clock. The propagation delay circuitry 320 provides for both measurement of, and control according to, fractional parts of a clock cycle of the internal clock.

In order to use the PWM clock to control the start of each PWM pulse and the free running clock internal clock to control its duration, it is necessary to calibrate, or measure, the internal clock against the PWM clock. The calibration will be described in more detail below, but requires the measurement of the number, q, of clock cycles of the internal clock corresponding to a predetermined number p of clock cycles of the PWM clock. As shown in this nonlimiting example, at 1124 p may be equal to 2 and, at 1128, q may be equal to 34. Further, as can be seen in FIG. 11, the duration of an integral number p clock cycles of the PWM clock may not exactly correspond to that of an integral number q of clock cycles of the internal clock. The fractional part may be indirectly evaluated by a second measurement (using the above-mentioned propagation delay circuitry 320), as will be described in more detail hereinbelow.

Once the internal clock has been calibrated against the PWM clock and the propagation delay circuitry has been calibrated against the internal clock, this information may be used by the system in order to control the pulse width of each PWM pulse to an accuracy which is greater than that provided by the internal clock alone. This is illustrated schematically in FIG. 11 since the falling edge 1126 of the PWM pulse 1116 does not correspond to a rising edge of the internal clock. Rather, the falling edge is controlled by a combination of the internal clock and the propagation delay circuitry 320, again as will be described in more detail hereinbelow.

As already mentioned, applications of the present disclosure include wireless charging, in which information may be transferred to a receiving device, by modifying the fundamental frequency of the AC signal using frequency shift keying (FSK). In order to effect this communication, it is necessary that the receiving device can effectively and accurately measure the fundamental frequency. One way of doing so is by determining the zero crossings of the received AC signal. However since, close to the zero crossings, a relatively small amount of power is transferred, it is possible to encounter erroneous or spurious zero crossings, which can interfere with the above measurements.

The present inventors have appreciated that it may be possible to reduce or even eliminate spurious zero crossings by appropriate control of the FETs of the inverter, around the moments of zero crossings, for instance, by limiting the voltage differences occurring at or close to the zero crossings. One way to achieve this is to control the switches S1 and S2 which may be implemented as FETs Q1 and Q2 as shown in FIG. 2 and as described hereinbelow with reference to FIGS. 10 and 11, in the first half cycle of the AC signal independently, or separately, from that of S3 (along with S4) in the second half cycle.

Further, the inventors have appreciated that totally independent control is not necessary to reduce or even eliminate spurious zero-crossings of the received signal: rather, the extra "degree of freedom", which may be provided by being able to control the start time of the PWM sequence for the second half cycle, relative to that for the first half cycle, allows control of the voltage differences applied around the "true" (positive-to-negative-going) zero crossing 1140, which can reduce or eliminate spurious zero-crossings. Since the set of pulses for each half-cycle need not be identical, this extra degree of freedom may also assist in reducing or eliminate spurious zero-crossings around the corresponding "true" negative-to-positive-going zero crossing 1141. By decoupling the multiplexer select signal 1111 for selecting the half-cycle from the generation of pulses for the two half-cycles, a corresponding independent control is achieved. This will be discussed in more detail with reference to FIGS. 13 and 14. The independent control of the start time of the negative half-cycle relative to the positive half-cycle is shown schematically in FIG. 11 by the offsets 1132 and 1134, which each may be controllable or adjustable, and may be put into effect by delaying the start of the series of pulses 1112 and 1114 by an integral number of periods of the second, internal clock.

As will be further described, embodiments of the present disclosure utilize a concatenation of the inter-clock portion and the intra-clock portion to designate each of the pulse widths of the PWM pulses to be generated, the inter-clock portion and intra-clock portion each being calculated based on first and second measurements (to be described in more detail hereinbelow). Note that though the measurements are referred to herein as the first measurement and the second measurement, such labels are used merely for identification purposes within the description and the claims, and do not necessarily indicate the relative timing for performing each of these measurements.

Moreover, as further described herein, the measurements may be performed on a continuous and/or dynamic basis so that fluctuations in the generation of the internal clock signal (e.g., as resulting from variations in temperature or voltage, or even inherent inaccuracies associated with the circuitry utilized to generate the internal clock signal) are compensated for, since such fluctuations will be accounted for within the first and second measurements. As such, embodiments of the present disclosure enable usage of an internal clock signal that is not required to be particularly accurate, and also does not require any trimming to be performed after the initial manufacturing of the integrated circuit. Instead, embodiments of the present disclosure are configured to continuously observe this internal clock signal, and effectively perform an automatic trimming to compensate for inaccuracies that might result from temperature/voltage variations as well as differences between multiple devices caused by the device fabrication process.

The PWM Clock and Data Generation element 201 may be implemented within a microcontroller, wherein the generated PWM clock signal 213 and the PWM shaping information, that is to say, the set of pulse data 214, may be forwarded from such a microcontroller to the PWM pulse synthesis unit 202, which may be a distinct or separate device. Although the functionalities of the PWM Data Clock and Generation element 201 and the PWM pulse synthesis unit 202 may be combined within the same microcontroller or other type of integrated circuit, in general, PWM Clock and Data Generation element 201 is implemented entirely by software within a conventional microcontroller unit, or suitably configured by software. In contrast, the PWM Pulse Synthesis unit 202 is, in general, provided entirely by hardware. In particular, in accordance with certain embodiments of the present disclosure, the signal synthesiser 206 may be implemented as fully digital circuitry.

Figure 13:
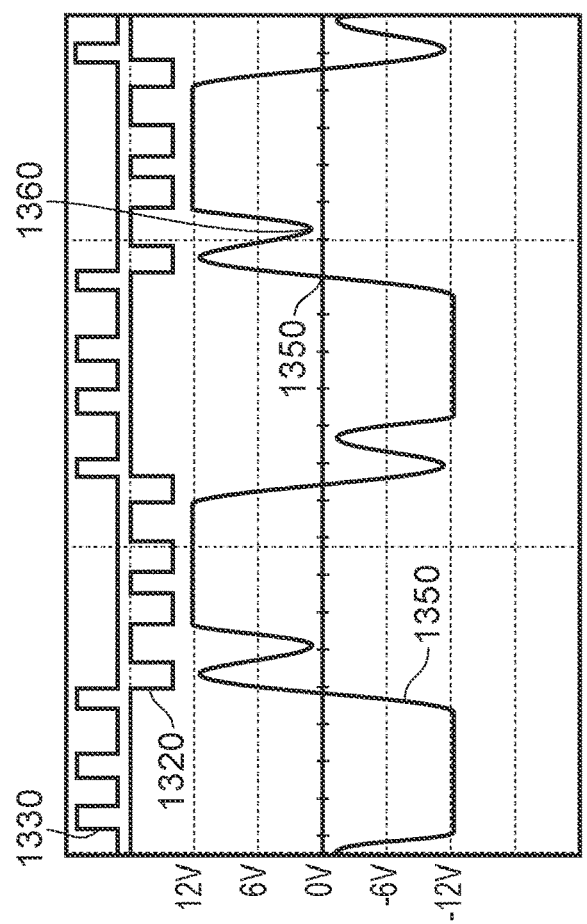
FIGS. 12 and 13 illustrates signals with, and without, spurious zero-crossings.

Considering now FIGS. 12 and 13, these illustrate, plotted on the Y-axis or ordinate voltage, waveforms, respectively 1210 and 1310, for the AC signal at a wireless transfer receiver of a PWM AC signal generated, in FIG. 12, by a circuit such as that shown in FIG. 3, and in FIG. 13 by a circuit such as that shown in FIG. 14 according to one or more embodiments, which will be discussed in more detail hereinbelow. Also shown are, for FIG. 13, nominal PWM pulses 1320 for the right side of the half-bridge, controlling the positive half of the AC signal, and 1330 for the left side of the half-bridge controlling the negative half of the AC signal.

Figure 12:
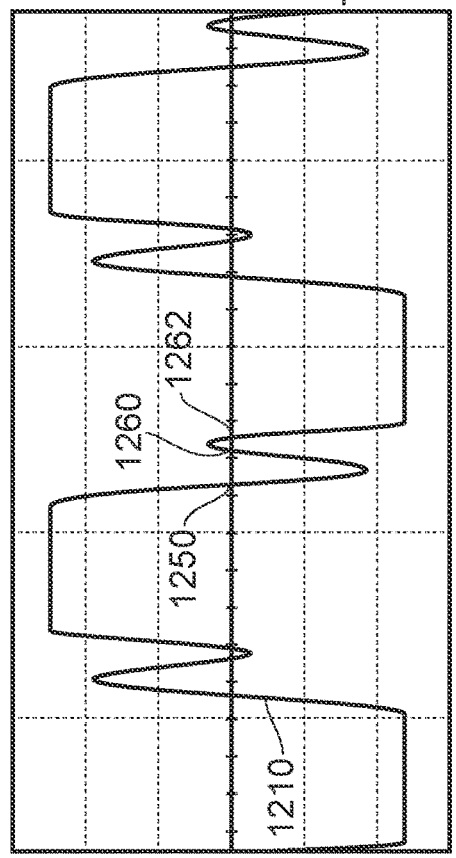

In FIG. 12, there is seen, close to the "true" zero crossing 1250 indicating the transition from the positive to the negative half cycle of the AC signal, a pair of spurious zero crossings 1260, 1262. By adjusting the timing of the series of pulses 1320 relative to the series of pulses 1330, according to embodiments of the present disclosure, the spurious zero crossings can be reduced or eliminated, as shown in FIG. 13 in which, close to the true zero crossing 1350, no spurious zero crossings occur, although, as noted, there may be a temporary reduction in the voltage corresponding in a local minimum 1360.

Figure 3:
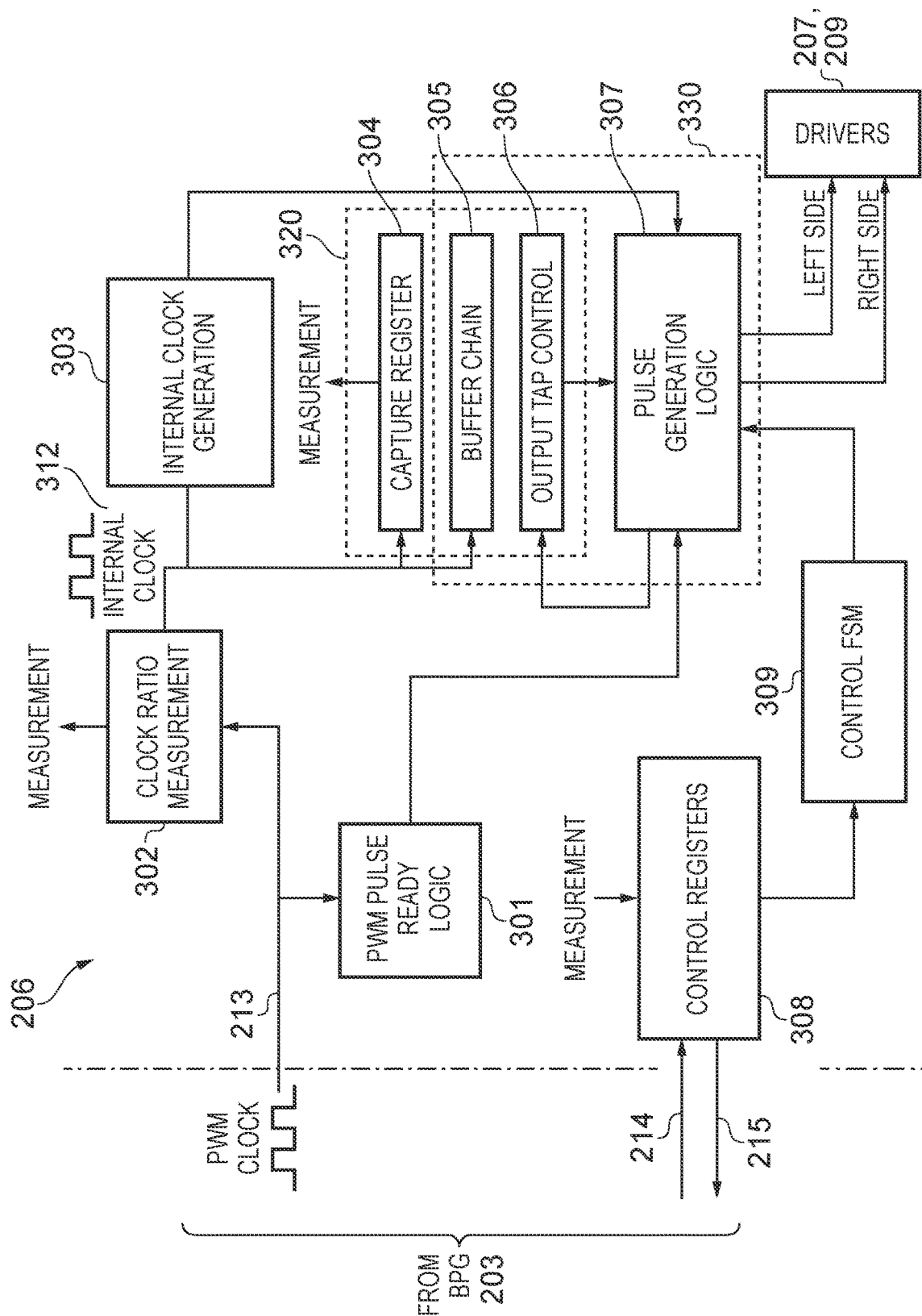
FIG. 3 illustrates a block diagram of PWM pulse generation configured for a complete AC cycle.

Referring now back to FIG. 3, the signal synthesiser 206 receives the PWM clock signal 213 as time base information. As will be described, the PWM clock is used to trigger the start of each PWM pulse, such that the actual start occurs on the next rising edge of a second clock. For example, the system may be configured to generate a PWM pulse every n-th PWM clock cycle, wherein n is an integer greater than or equal to 1. However, the PWM clock signal is not used to directly control the pulse or its width. The PWM clock may be configured to be "relatively slow" (e.g., 20-40 MHz). The signal synthesiser 206 uses or implements the second clock, which in this example is an internally generated clock signal, which may be configured to be a faster (relative to the frequency of the PWM clock signal) internal free-running clock signal (e.g., utilizing any well-known clock generation circuit 303). Note that the precise clock frequency generated for the internal clock signal is irrelevant and may change across technologies/devices/time, and thus permits a very simple implementation for such a clock generation circuit 303 (e.g., in the form of a digital ring oscillator), and can be implemented to be as fast as the technology selected for the signal synthesiser 206 permits (e.g., ~500 MHz), although generation of an internal clock signal in the GHz range is not necessarily needed. This permits the usage of cost-efficient technologies (e.g., better suited for implementing class D driver elements for the drivers 207, 209), and diminishes the negative effects of other associated issues (e.g., emissions resulting from utilization of a GHz signal, etc.). The various elements illustrated in FIG. 3 will be further described with respect to FIGS. 4-8.

Figure 4:
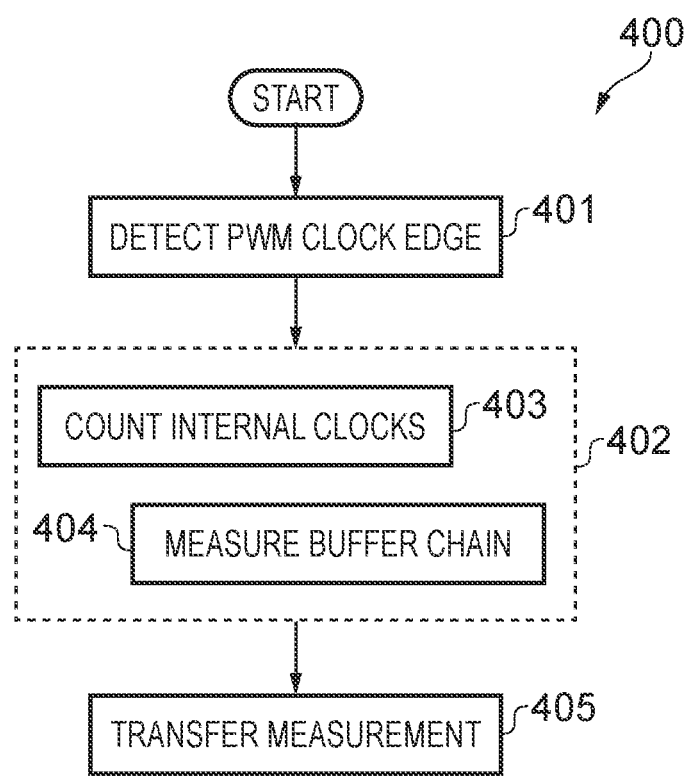
FIG. 4 illustrates a flowchart block diagram of measurements used for determining PWM pulses.

Referring to FIG. 4 with reference to FIG. 3, there is illustrated a flowchart block diagram of a system and method 400 for performing the previously noted first and second measurements. In block 401, the clock ratio measurement circuitry 302 detects a clock edge of the PWM clock signal received from the BPG block 203. This detected PWM clock edge is utilized as a time reference for the measurement performed by the clock ratio measurement circuitry 302. The block 402 outlined by the dashed line represents performances of the first and second measurements within the signal synthesiser 206. In the block 403, the clock ratio measurement circuitry 302 determines a ratio of the frequency of the PWM clock signal received from the BPG block 203 to the frequency of the internally generated clock signal supplied and generated by the internal clock generation circuitry 303. For example, the clock ratio measurement circuitry 302 may be implemented with a counter that counts the number of pulses of the internal clock signal corresponding to one or more cycles of the PWM clock signal. This ratio is thus an integer (if a single PWM clock cycle is used), or a rational number, with a divisor or which is no greater than the number of PWM clock cycles used in the measurement). To take a nonlimiting concrete example, if the PWM clock cycle is 20 MHz, and the internal free running clock is running at 807 MHz, the ratio would be determined to be "40" if a single PM clock cycle is used for the measurement, and the ratio would be determined to be 40 1/10 (or 40.1), if 10 PWM clock cycles are used to the measurement. (It will be appreciated that an actual calculation need not be involved, or may be performed in software in the PWM clock and data generation element 201.)

Figure 5:
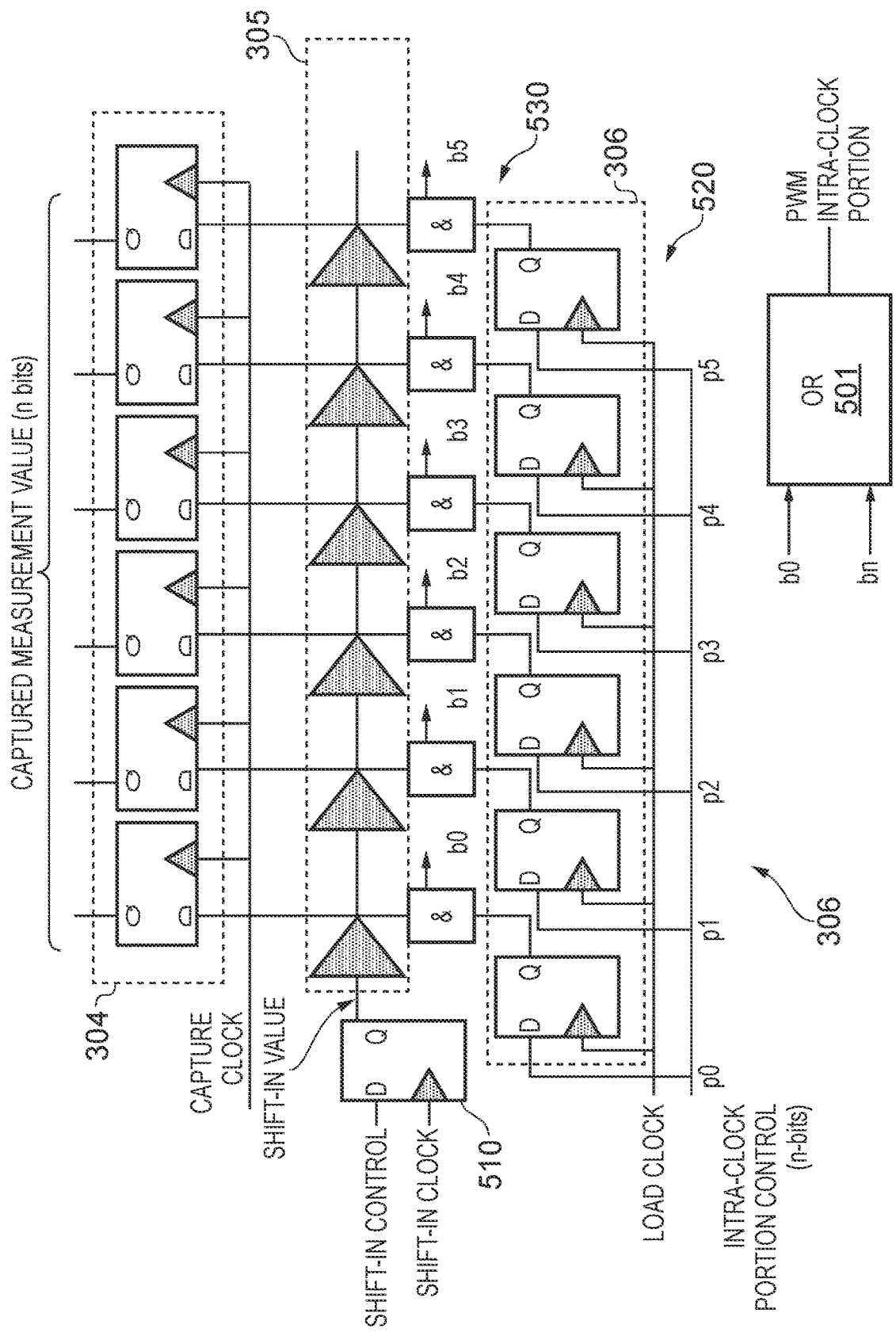
FIG. 5 illustrates a logic circuit diagram configured in accordance with embodiment of the present disclosure.

As will be further described with respect to FIG. 5, in the block 404, a buffer chain 305 is utilized to measure the number of propagation delay elements (e.g., delay buffers) that correspond to the propagation delay associated with a single cycle of the internal clock signal. This second measurement by the buffer chain 305 is captured by the capture register 304, and may be translated by logic into an integer number identifying an amount of significant bits in the capture register.

In the block 405, the measurement results by the clock ratio measurement circuitry 302 and within the capture register 304 are transmitted to and stored within registers of the control registers 308. These measurement results are transferred to the BPG block 203. Such transfers may occur regularly or irregularly; e.g., a transfer may be performed only when the measurement results have changed.

The BPG block 203 determines, according to the first and second measurements, a pair of parameters, being a quantity of free running clock pulses plus a quantity of propagation elements, which corresponds to one complete period of the PWM clock signal. As will be described in more detail hereinbelow, the PWM signal has a period which is an integral multiple of the period of the PWM clock. Thus, from this pair of parameters, the BPG block 203 is able to determine a number of clock cycles of the free running internal clock (either as an integer, or a low-value-denominator fraction) together with a number of propagation elements which corresponds to a complete period of the PWM signal—which corresponds to a number of clock cycles of the free running internal clock together with a number of propagation elements which together correspond to a PWM duty cycle of 100%. Thence the BPG block 203 is able to determine a number of clock cycles of the free running internal clock and a number of propagation elements, which together correspond to any chosen duty cycle or pulse width.

FIG. 5 illustrates further details of a non-limiting exemplary implementation of the capture register 304, the buffer chain 305, and the output tap control 306, collectively referred to as the propagation delay circuitry 320. As previously noted, for calculations of certain pulse widths within the BPG block 203, use of only the first measured parameter (i.e., the ratio of the frequencies of the PWM clock signal and the internal clock signal) is insufficient to accurately designate such pulse widths in a satisfactory manner. As a result, embodiments of the present disclosure incorporate the second measured parameter in order to improve the accuracy. In accordance with embodiments of the present disclosure, the required accuracy of the widths (i.e., pulse widths) for generated PWM pulses is achieved by implementation of the buffer chain 305, which provides the portion of the PWM pulse width accuracy that cannot be generated solely with use of the internal clock signal. Such an achievable accuracy is technology dependent (i.e., on the technology utilized to implement the propagation delay elements within the buffer chain 305), and may provide at least two to three more bits of extra accuracy.

As will be described in more detail with respect to FIG. 6, the buffer chain 305 and the capture register 304 are utilized to perform the second measurement (in order to accurately scale the internal free running clock against the buffer chain). In accordance with embodiments of the present disclosure, the buffer chain 305 includes a plurality of propagation delay elements (e.g., delay buffers) coupled in series, whereby the first delay buffer has its input receiving a shift-in value from an output of the shift-in flip-flop 510. Under control of a shift-in clock signal, which is derived from the internal clock signal, the flip-flop 510 receives as its data input a shift-in control signal. The capture register 304 includes a plurality of flip-flops corresponding to each of the delay buffers of the buffer chain 305.

As will be described with respect to FIG. 7, the buffer chain 305 and the output tap control 306 are utilized to determine the intra-clock portion of the pulse widths for each PWM pulse to be generated. In other words, the resulting second measured parameter is used in a calculation of an appropriate number of propagation delay elements required (together with an integral number of internal clock cycles) to closely match each PWM pulse width to a respective desired pulse width. The output tap control 306 includes a plurality of flip-flops 520, each corresponding to one of the delay buffers in the buffer chain 305. For illustrative reasons, the example in FIG. 5 uses a buffer chain consisting of only n=6 buffers; a real implementation may utilize a different number as described later. Each of the flip-flops 520 within the output tap control 306 is controlled by a load clock signal, which is also derived from the internal clock signal. As will be further described, the data input to the flip-flops 520 of the output tap control 306 is an n-bit intra-clock portion control signal, with these data inputs designated as p0-p5. The output tap control 306 further includes a plurality of logic AND gates 530 each corresponding to one of the delay buffers within the buffer chain 305. The inputs to each of the logic AND gates 530 are outputs from its corresponding delay buffer and flip-flop. The outputs of the logic AND gates 530 are designated herein as b0-b5. The output tap control 306 further includes a logic OR gate 501 that receives the b0-b5 outputs from the logic AND gates 530, and outputs an intra-clock portion signal for use by the pulse generation logic 307 in production of each of the PWM pulses. The pulse generation logic 307, together with the propagation delay circuitry 320, and in particular the subset of the propagation delay circuitry comprising the buffer chain 305 and the output tap control 306, may be referred to as a pulse synthesis circuit 330.

Note that embodiments of the present disclosure are not limited to the particular configuration illustrated in FIG. 5. Though the buffer chain 305 is illustrated as having six delay buffers, the capture register 304 as having six flip-flops, and the output tap control 306 as having six flip-flops and six logic AND gates, embodiments of the present disclosure may be implemented with any number of such elements. For example, certain embodiments may be implemented with a much larger buffer chain and related elements (e.g., capture flip-flops, AND gates, output tap control flip-flops). Typical delay chains are often implemented using 32 to 128 delay elements. For example, the minimum number of elements for the buffer chain 305 can be calculated for a given technology from the technology parameters for the selected delay elements (e.g., minimum delay of a minimum delay buffer) and the potential maximum frequency of the internal clock generation circuitry 303.

Figure 6:
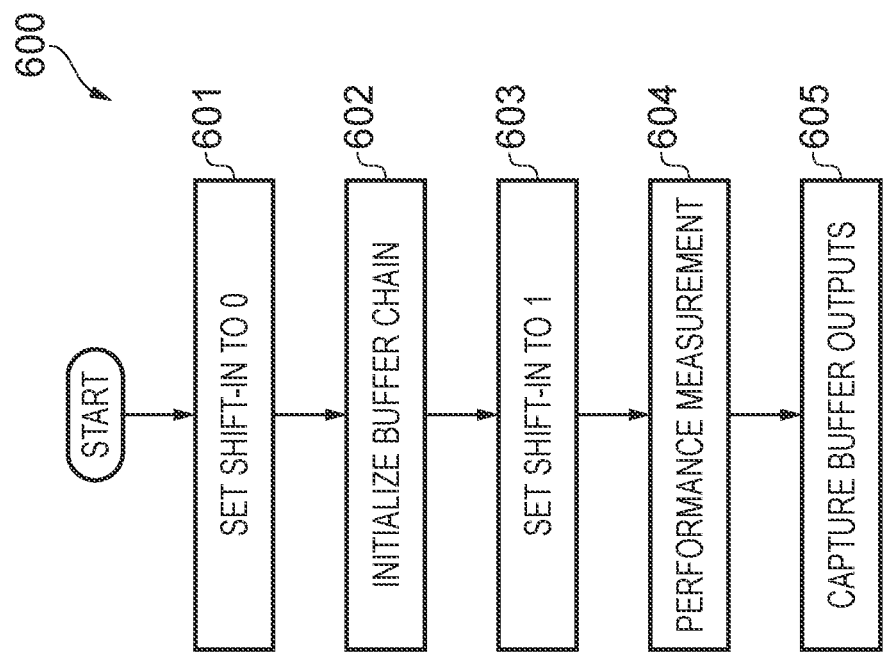
FIG. 6 illustrates a flowchart block diagram of measurement of an intra-clock portion of an internal clock in accordance with embodiments of the present disclosure.

FIG. 6 illustrates a flowchart block diagram of a system and method 600 for performing the second measurement pertaining to the intra-clock portion, i.e., a measurement that determines how many of the delay buffers (i.e., the signal propagation delay associated with the delay buffers) fall within a single cycle of the internal clock signal. Various aspects of the system and method 600 may be performed under the control of a finite state machine (FSM) 309. In the block 601, a logic 0 value is set by shifting in such a logic 0 value into the flip-flop 510 (as the shift-in control value) for output to the buffer chain 305 as the "shift-in value". In the block 602, the buffer chain 305 is initialized with the shift-in logic 0 value (e.g., by the passing of a predetermined number of cycles of the internal clock signal) so that all of the delay buffers have a logic 0 output. The number of cycles of the internal clock signal utilized for such an initialization may be determined by sensing when the output of the last delay buffer in the buffer chain 305 outputs a logic 0 value, or may be predetermined within the system and method 600 since the minimum and maximum delay of each of the delay buffers within the buffer chain 305 are known technology parameters. In the block 603, a logic 1 value is then shifted into the buffer chain 305 through the flip-flop 510 for output to the buffer chain 305 as the "shift-in value," which starts the measurement.

In the block 604, a measurement is then performed after passage of a complete cycle of the internal clock signal. Note that a single cycle of the internal clock signal may be sufficient for performing such a measurement. However, in accordance with alternative embodiments of the present disclosure, multiple measurements may be performed that involve passage of more than one cycle of the internal clock signal (utilizing a larger delay chain that is appropriately sized for this purpose) and then averaging these multiple measurement results. In the block 605, outputs of the delay buffers within the buffer chain 305 are captured within corresponding flip-flops of the capture register 304. The plurality of flip-flops is configured to capture the outputs of the delay buffers in response to assertion of a capture clock signal derived from the internal clock signal, wherein the assertion of the capture clock signal occurs one clock period of the internal clock signal subsequent to the assertion of the shift-in clock signal. As an example, using the buffer chain with n=6 shown in FIG. 5, as the shift-in logic 1 value is propagated through the delay buffers of the buffer chain 305, after passage of a complete cycle of the internal clock signal (or a derivation thereof), the logic 1 value may have propagated through the first four delay buffers. At that moment, since the internal clock signal (or a derivation thereof) is also being used to clock the corresponding flip-flops of the capture register 304, the logic values at the outputs of all of the delay buffers of the buffer chain 305 will be output to their corresponding flip-flops. In this non-limiting example with six delay buffers, the measurement value captured within the capture register will be a 6-bit value of 111100, which would represent that the amount of propagation delay associated with four delay buffers approximately equates to the time passage of one complete cycle of the internal clock signal. This captured measurement value (the second measurement) is then output from the capture register 304 and stored in registers within the control registers 308. For this purpose, in accordance with certain embodiments of the present disclosure, the measurement result may be condensed (e.g., by counting the number of leading 1's and only storing this number in a control register).

Figure 7:
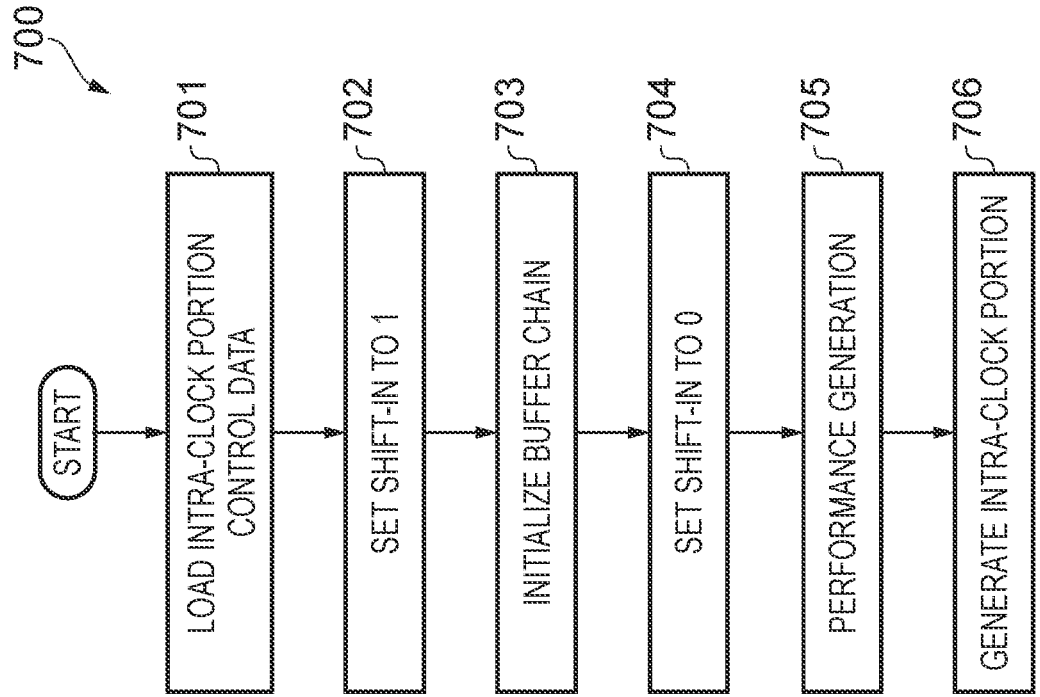
FIG. 7 illustrates a flowchart block diagram of a generation of the intra-clock portion of a PWM pulse in accordance with embodiment of the present disclosure.

FIG. 7 illustrates a system and method 700 for generating or synthesising the intra-clock portion of pulse widths for each PWM pulse being generated or synthesised by the pulse generation logic 307. Results of the system and method 700 are utilized by the block 805 as further described herein with respect to FIG. 8. Various aspects of the system and method 700 may be performed under the control of the FSM 309.

Recall that the BPG block 203 had utilized the second measured parameter to calculate the intra-clock portion of the PWM shaping information, for each particular PWM pulse to be generated. This intra-clock portion is referred to with respect to FIGS. 5 and 7 as the intra-clock portion control data. In the block 701, for each particular PWM pulse to be generated, the control FSM 309 loads the intra-clock portion control bits into the flip-flops 520 (represented as the m-bit p0—p5 values in FIG. 5) under control of a load clock signal, which is derived from the internal clock signal. These intra-clock portion control bits designate the number of delay buffers in the buffer chain 305 determined by the software (e.g., see the system and method 900 described with respect to FIG. 9) executing in the BPG block 203 to represent the fractional portion of a single cycle of the internal clock signal to be added to the integer multiple of cycles of the internal clock signal (as calculated by the software) in order to more accurately create or synthesise the pulse width of the PWM pulse to be generated.

Before the intra-clock portion control data is used to generate the intra-clock portion, blocks 702-703 initialize the buffer chain 305. In the block 702, a logic 1 value (the shift-in control) is shifted in by the shift-in clock to the buffer chain 305 through the flip-flop 510 for output to the buffer chain 305 as the "shift-in value." In the block 703, a number of clock cycles of the internal clock signal (or a derivation thereof) are allowed to pass in order to initialize the delay buffers within the buffer chain 305 so that all of the delay buffers have a logic 1 output. The number of cycles of the internal clock signal utilized for such an initialization may be determined by sensing when the output of the last delay buffer in the buffer chain 305 outputs a logic 1 value, or may be predetermined within the system and method 700 since the minimum and maximum delay of each of the delay buffers within the buffer chain 305 are known technology parameters.

After the initialization of the delay buffers, the buffer chain 305 is then ready for generating of the intra-clock portion in combination with the output tap control 306. In the block 704, a logic 0 value is shifted into the buffer chain 305 through the flip-flop 510 (as the shift-in control value) for output to the buffer chain 305 as the "shift-in value." In the block 705, generation of the intra-clock portion is performed by forwarding the logic 0 value for propagation through the delay buffers in the buffer chain 305, which starts the generation.

In the block 706, as the logic 0 value propagates through the delay buffers, the intra-clock portion is output by the combinatorial logic circuitry of the logic AND gates 530 and the logic OR gate 501.

Consider the following non-limiting example whereby the BPG block 203 has determined that the pulse width for the next PWM pulse to be generated by the pulse generation logic 307 will utilize three of the delay buffers in the buffer chain 305. The intra-clock portion of the PWM pulse shaping information, that is to set, the second part of one of the data pairs in the set of pulse data 214, received by the control registers 308 and delivered by the control FSM 309 to the flip-flops 520 as the intra-clock portion control bits will load the bits 111000 as the p0—p5 values into the flip-flops 520.

Upon completion of the last internal clock cycle counted by the pulse generation logic 307 for generating the PWM pulse, the blocks 704 and 705 are performed whereby a logic 0 value is shifted-in to the buffer chain 305 for propagating through the delay buffers. Recall that the buffer chain 305 had been previously initialized by the blocks 702-703 to contain logic 1 values at the outputs of all of the delay buffers. Thus, it can be readily understood that until the logic 0 value has propagated through the third delay buffer of the buffer chain 305, the combinatorial logic of the logic AND gates 530 and the logic OR gate 501 will output a logic 1 value as the intra-clock portion output from the logic OR gate 501.

Therefore, until this occurrence, the PWM pulse will continue to be generated by the pulse generation logic 307 as further described with respect to the block 805 of the system and method 800. When the logic 0 value has propagated through the third delay buffer, then, as described with respect to the block 806, the logic 0 value for the intra-clock portion output from the logic OR gate 501 will trigger the pulse generation logic 307 to complete the pulse width of the generated PWM pulse.

Note that the generation of the intra-clock portion may be performed in the clock cycle after the last full internal clock cycle needed for generating a PWM pulse. As can be readily appreciated, for every PWM pulse to be generated by the pulse generation logic 307, there may be different intra-clock portion control data that is then loaded into the flip-flops 520 of the output tap control 306.

Figure 8:
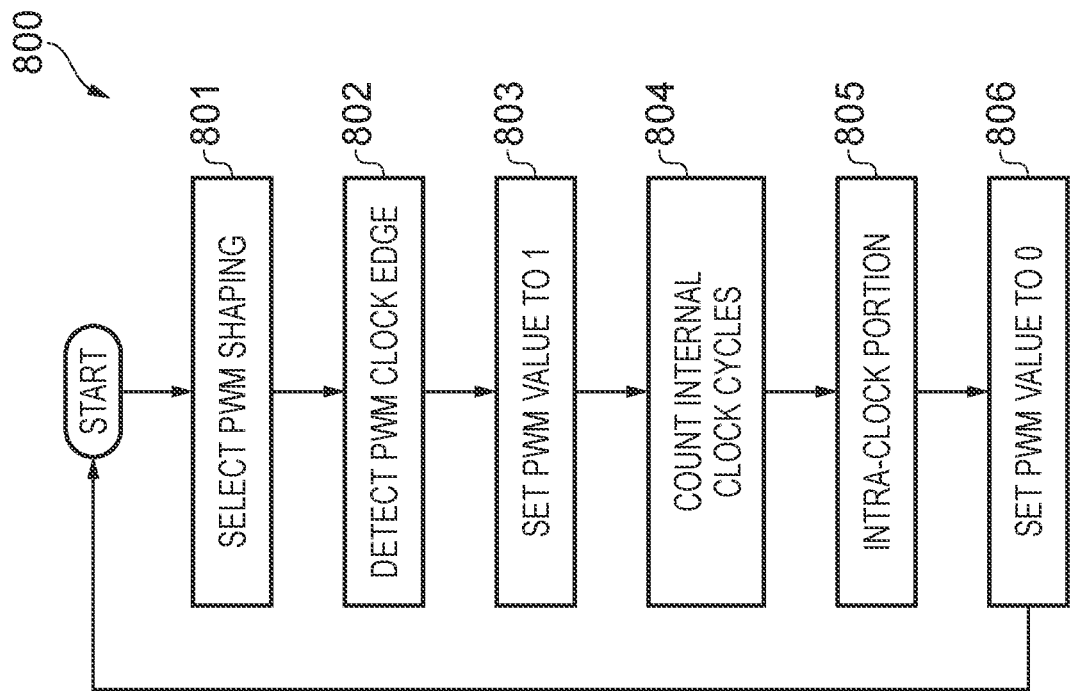
FIG. 8 illustrates a flowchart block diagram of a generation a PWM pulse in accordance with embodiments of the present disclosure.

FIG. 8 illustrates a flowchart block diagram of a system and method 800 for generation of each of the PWM pulses. Various aspects of the system and method 800 may be performed under the control of the FSM 309. In the block 801, the control FSM 309 selects the PWM shaping information (i.e. the data pair) to be utilized for generating the next PWM pulse by the pulse generation logic 307. This will generally be data that is part of the pulse shaping data held in the control registers 308, and includes the result of the calculations performed by the BPG block 203, (see FIG. 9) of the inter-clock portion and the intra-clock portion that designate the pulse width of the next PWM pulse to be generated. The control FSM 309 may monitor the PWM clock signal to determine when to retrieve the PWM shaping information from the control registers 308, since, for example, the system may be designed to generate a PWM pulse every n-th cycle of the PWM clock signal.

In addition, the control registers 308 may include two sets of registers—one for the set of data pairs corresponding to the pulse width of pulses currently being used, and another set data pairs corresponding to pulse width of pulses which will be used in a subsequent cycle of the AC signal. This latter set may therefore be updated without disturbing the current pulse generation.

In the block 802, the pulse generation logic 307 utilizes a detected clock edge of the PWM clock signal by the PWM pulse start logic circuitry 301, which is utilized as a time reference for generation of each of the PWM pulses (i.e., when to begin generation of each PWM pulse). The PWM pulse start logic circuitry 301 may be implemented as a clock edge sensing circuit, which can observe the PWM clock signal and count the number of clock edges; after a predetermined number of counted clock edges, an output signal is sent to the pulse generation logic 307.

In the block 803, circuitry within the pulse generation logic 307 sets the logic value for generating the PWM pulse to a logic value of 1 (also referred to herein as the "PWM pulse generation value"), which is enabled by the detected PWM clock edge but actually triggered by the internal clock. In other words, the pulse generation logic 307 utilizes the detected PWM clock edge to determine when it is enabled to begin generation of the next PWM pulse, and then uses the internal clock signal to trigger the start of the next PWM pulse, which can be performed by setting the PWM pulse generation value to 1. As is well-known in the art, logic circuitry for generating pulses may do so in response to a received logic signal whereby a pulse is generated when the received logic signal has an asserted logic value (e.g., a logic 1 value), and the pulse is not generated when the received logic signal has not been asserted (e.g., a logic 0 value). The pulse generation logic 307 also will select whether the left-side driver 207 or the right-side driver 209 will utilize this particular PWM pulse.

In the block 804, the pulse generation logic 307 counts (e.g., with a well-known clock cycle counter) a number of cycles of the internal clock signal as defined by the calculated inter-clock portion of the PWM shaping information received from the control registers 308. It is during this time that the inter-clock portion of the PWM pulse to be generated is produced whereby the PWM pulse generation value for the PWM pulse being generated is maintained at a value of 1. Note that performance of the blocks 702-703 may occur sometime during the performance of the block 804 in order to initialize the buffer chain 305 as described with respect to FIG. 7, which may be performed n−1 clock cycles before the counter reaches the defined value in the PWM shaping information (where n is the number of clock cycles for all buffer elements to have a defined output value, as described earlier). A performance of the blocks 702-703 in these cycles permits use of the buffer chain 305 in all earlier clock cycles of the performance of the block 804 for performing at least one measurement as described in the system and method 600 of FIG. 6. In accordance with embodiments of the present disclosure, utilization of the buffer chain 305 for performing both the second measurement (see the system and method 600 of FIG. 6) and the generation of the intra-clock portion of the PWM signal, as described in FIG. 8, may result in the consistent and accurate use of the corresponding buffer delay elements across all possible process, temperature, and voltage dependencies that might be experienced within circuitry implementing the Signal synthesiser 206 and/or the PWM pulse synthesis unit 202.

In the block 805, the intra-clock portion to be generated is received from the logic OR gate 501 of the output tap control 306 (see the blocks 705-706 of the system and method 700 described with respect to FIG. 7). The pulse generation logic 307 may be configured to accomplish this during the last internal clock cycle of the number of internal clock cycles counted during the block 804, for example, since the generation of the PWM pulse is a function of the received internal clock signal, which is also used as the load clock for the flip-flops 520. The pulse generation logic 307 will maintain the PWM pulse generation value at a value of 1 as long as the output logic value of the logic OR gate is a 1. As can be readily appreciated, the pulse generation logic 307 generates each of the PWM pulses by effectively concatenating the inter-clock portion and the intra-clock portion that designate the pulse width of the next PWM pulse to be generated.

In the block 806, the PWM pulse generation value for the PWM pulse being generated is set to a value of 0 after the number of cycles of the internal clock signal (as designated by the calculated inter-clock portion of the PWM shaping information) have passed and the amount of time has passed as determined by receipt of the intra-clock portion signal from the logic OR gate 501. This may be performed by logic circuitry within the pulse generation logic 307, such as a combinatorial logic OR of the output of the clock cycle counter being set to a logic value of 0 after counting all of the specified internal clock cycles, and the output of the logic OR gate 501. As understood by those skilled in the art, any additional delays associated with the implementations of the logic AND gates 530 and logic OR gate 501 on the generated intra-clock portion and a final OR gate (which may be implemented to perform a logical OR on the output of the inter-clock delay (the number of full internal clock cycles) and the intra-clock delay (the output of the logic OR gate 501) can be easily compensated for in the generation of the final PWM signal; e.g., by implementing an equivalent logic that delays the start of the PWM pulse accordingly (as a non-limiting example since there are other ways to achieve this compensation).

The foregoing system and method 800 may be repeated for each of the PWM pulses generated by the pulse generation logic 307.

Due to the implementation of the internal clock signal separately from the PWM clock signal, the system is capable of operating even when there are changes in the fundamental frequency.

Figure 9:
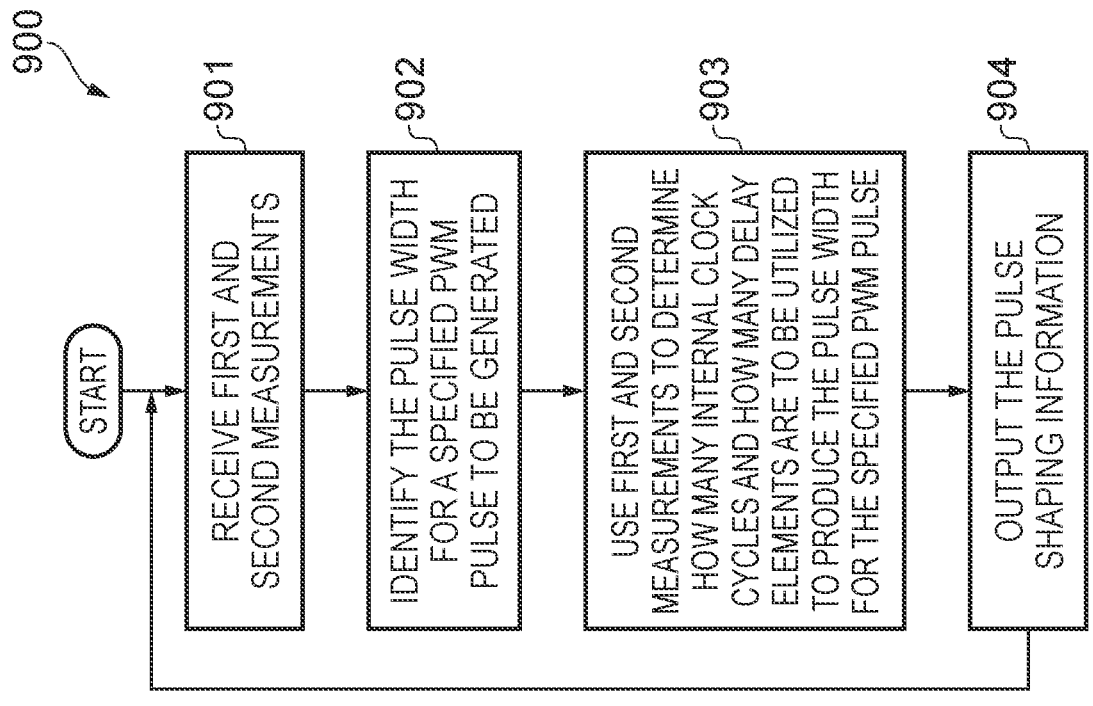
FIG. 9 illustrates a flowchart block diagram of calculating PWM pulse width information in accordance with embodiments of the present disclosure.

Referring to now FIG. 9, there is illustrated a non-limiting example of a system and method 900 configured to calculate the pulse shaping information to be utilized for the generation of PWM pulses as a function of the first and second measurements. The system and method 900 may be implemented in part or entirely within the BPG block 203 (see block 406 of FIG. 4). In the block 901, the BPG block 203 receives the most recent first and second measurements from the control registers 308. In the block 902, the BPG block 203 identifies the pulse width for the next PWM pulse to be generated to meet the power requirement, the pulse width begin provided from power level software function or power level block 205 including pulse width calculation element 212. In the block 903, the BPG block 203 uses the first and second measurements to determine how many cycles of the internal clock signal (the "PWM inter-clock portion") and how many propagation delay elements of the buffer chain 305 (the "PWM intra-clock portion") are to be utilized to produce the pulse width determined in the block 902. In the block 904, the calculated inter-clock portion and intra-clock portion, that is to say, the first and second part of a data pair, are included in the PWM shaping information (i.e. the set of pulse data 214) that is then transferred from the BPG block 203 to the control registers 308. As described, the inter-clock portion (i.e. the first part of a data pair) will be utilized by the pulse generation logic 307 to count the number of cycles of the internal clock signal for generating the initial portion of the PWM pulse, and the intra-clock portion (i.e. the second part of the data pair) will be utilized by the output tap control 306 to establish the remaining fractional portion of the generated PWM pulse. The system and method 900 then returns to the Start to repeat the foregoing to calculate the PWM shaping information from the most recent first and second measurements for the next PWM pulse to be generated. In accordance with certain embodiments of the present disclosure, the receiving of measurement results 901 may be performed before performing all corresponding calculations, and the output of the generated pulse shaping information 904 (i.e. a set of pulse data 214)) may be performed after performing all these calculations.

As will be particularly apparent from FIGS. 1 to 8, aspects of the present disclosure provide A. A system for generating PWM pulses each having a specified pulse width and suitable for generating a signal at a specified frequency, the system comprising: clock ratio measurement circuitry configured to perform a first measurement of a ratio between a first frequency of a first clock signal and a second frequency of a second clock signal;

propagation delay circuitry configured to perform a second measurement of a number of propagation delay elements through which a transition can propagate within a single cycle of the second clock signal;

circuitry configured to determine an inter-clock portion of a first specified pulse width as a function of the first measured parameter; circuitry configured to determine an intra-clock portion of the first specified pulse width as a function of the second measurement; and circuitry configured to output a PWM pulse signal having the first specified pulse width, wherein the first specified pulse width is composed of the inter-clock portion concatenated with the intra-clock portion.

B. The specified frequency of the signal to be generated may be related to the first frequency.

C. The first and second clock signals may be generated independently from each other. The pulse generation logic may be configured to output the PWM pulses every n-th cycle of the first clock signal, wherein n is an integer greater than or equal to 1.

D. The circuitry configured to determine the inter-clock portion of the first specified pulse width may include circuitry configured to calculate a maximum number of complete cycles of the second clock signal that fall within the first specified pulse width. The circuitry configured to determine the intra-clock portion of the first specified pulse width may include circuitry configured to calculate a maximum number of propagation delay elements through which a transition can propagate in an interval that falls within that portion of the first specified pulse width between a last complete cycle of the second clock signal and an end of the first specified pulse width, such that the intra-clock portion represents a less than whole fraction of a complete cycle of the second clock signal.

E. The system may further include that
the clock ratio measurement circuitry is configured to perform a third measurement of a ratio between a third frequency of the first clock signal and a fourth frequency of the second clock signal;
that the propagation delay circuitry is configured to perform a fourth measurement of a number of propagation delay elements corresponding to a single cycle of the second clock signal;
circuitry configured to determine an inter-clock portion of a second specified pulse width as a function of the third measurement;
circuitry configured to determine an intra-clock portion of the second specified pulse width as a function of the fourth measurement; and
circuitry configured to output a PWM pulse signal having the second specified pulse width, wherein the second specified pulse width is composed of the inter-clock portion concatenated with the intra-clock portion.

F. In the system of clause E, the third frequency may be different from the first frequency, wherein the third frequency is configured to generate a signal having a different frequency than the specified frequency.

G. In the system of clause E or F, the fourth frequency may be different from the second frequency due to variations in voltage or temperature of circuitry generating the second and fourth clock signals.

H. In any previously listed system, the propagation delay circuitry may comprise:
a buffer chain including a plurality of the propagation delay elements coupled in series;
a shift-in flip-flop having an output coupled to an input of a first one of the propagation delay elements, wherein the shift-in flip-flop is configured to load a particular logic value into the buffer chain in response to a shift-in clock signal derived from the second clock signal;
and a plurality of flip-flops each having an input coupled to an output of a corresponding propagation delay element, wherein the plurality of flip-flops are configured to capture the outputs of the propagation delay elements in response to a capture clock signal derived from the second clock signal, wherein assertion of the capture clock signal occurs one or more clock periods subsequent to assertion of the shift-in clock signal.

I. The circuitry configured to output the PWM pulse signal having the first specified pulse width may comprise:
a plurality of flip-flops configured to receive the intra-clock portion in response to a load clock signal derived from the second clock signal;
a plurality of logic AND gates each having a first input coupled to an output of a corresponding one of the propagation delay elements, and a second input coupled to an output of a corresponding one of the plurality of flip-flops;
a logic OR gate having inputs coupled to outputs of each of the plurality of logic AND gates;
and a shift-in flip-flop having an output coupled to an input of a first one of the propagation delay elements, wherein the shift-in flip-flop is configured to load a particular logic value into the number of propagation delay elements in response to a shift-in clock signal derived from the second clock signal.

J. Aspects of the present disclosure provide a method for generating PWM pulses each with specified pulse widths, wherein the method comprising determining a pulse width for a specified PWM pulse to be generated; determining a first measurement of a ratio between a PWM clock signal and an internally generated clock signal;
determining a second measurement of a number of propagation delay elements through which a transition can propagate within a cycle of the internally generated clock signal;
determining a first number of cycles of the internally generated clock signal and a second number of the propagation delay elements to be utilized to produce the pulse width for the specified PWM pulse as a function of the first and second measurements; and
utilizing the determined first number of cycles of the internally generated clock signal and the determined second number of propagation delay elements to generate the specified PWM pulse.

K. In the method of clause J, the PWM clock signal and the internally generated clock signal may be generated independently from each other by different clock generation circuits.

L. In the method of clause J or K, determining of the second measurement may comprise:
propagating a logic value through a series of delay buffers; and capturing a data value representing the number of the delay buffers that propagated the logic value during one or more cycles of the internally generated clock signal.

M. In the method of clause J, K or L, a width of the generated PWM pulse may be substantially equal to a time period as determined by the first number of cycles of the internally generated clock signal concatenated with the time for a transition to propagate through a second number of the propagation delay elements.

N. In the method of any of clauses J to M, the internally generated clock signal may have a frequency that varies with changes in temperature or voltage.

O. In the method of any of clauses J to N, the generated PWM pulses may be configured to produce an AC wireless charging signal.

P. Aspects of the present disclosure provide a system for generating PWM pulses each with individually designated pulse widths, wherein the system comprising
a first clock circuit configured to generate a first clock signal having a first frequency;
a second clock circuit configured to generate a second clock signal having
a second frequency, wherein the second frequency is greater than the first frequency;

clock ratio measurement circuitry configured to output a first measurement that is a ratio of the first frequency to the second frequency;

circuitry configured to output a second measurement of how many propagation delay elements substantially equate to a single cycle of the second cock signal; and circuitry configured to designate a pulse width for a PWM pulse as a function of the first and second measurements.

Q. The circuitry configured to output the second measurement may include a buffer chain including a plurality of the propagation delay elements coupled in series;

a shift-in flip-flop having an output coupled to an input of a first one of the propagation delay elements, wherein the shift-in flip-flop is configured to load a particular logic value into the buffer chain in response to assertion of a shift-in clock signal derived from the second clock signal; and a plurality of flip-flops each having an input coupled to an output of a corresponding propagation delay element, wherein the plurality of flip-flops are configured to capture the outputs of the propagation delay elements in response to assertion of a capture clock signal derived from the second clock signal, wherein the assertion of the capture clock signal occurs one clock period of the second clock signal subsequent to the assertion of the shift-in clock signal.

R. The pulse width of the PWM pulse may be designated by a concatenation of (1) a specified number of cycles of the second clock signal as calculated from the first measured parameter, and (2) a specified number of propagation delay elements as calculated from the second measured parameter.

S. The system may further include pulse generation logic configured to generate the PWM pulse, wherein the pulse generation logic comprising circuitry configured to begin generation of the PWM pulse in response to a selected clock edge of the first clock signal;

circuitry configured to continue generation of a first portion of the PWM pulse for a time period equal to a count of the specified number of cycles of the second clock signal;

circuitry configured to continue generation of a second portion of the PWM pulse concatenated to the first portion for a time period equal to passage of a logic value through the specified number of propagation delay elements under control of the second clock signal; and circuitry configured to stop generation of the PWM pulse after generation of the second portion.

T. The first and second clock circuits may be implemented so that the first and second clock signals are generated independently from each other.

Figure 14:
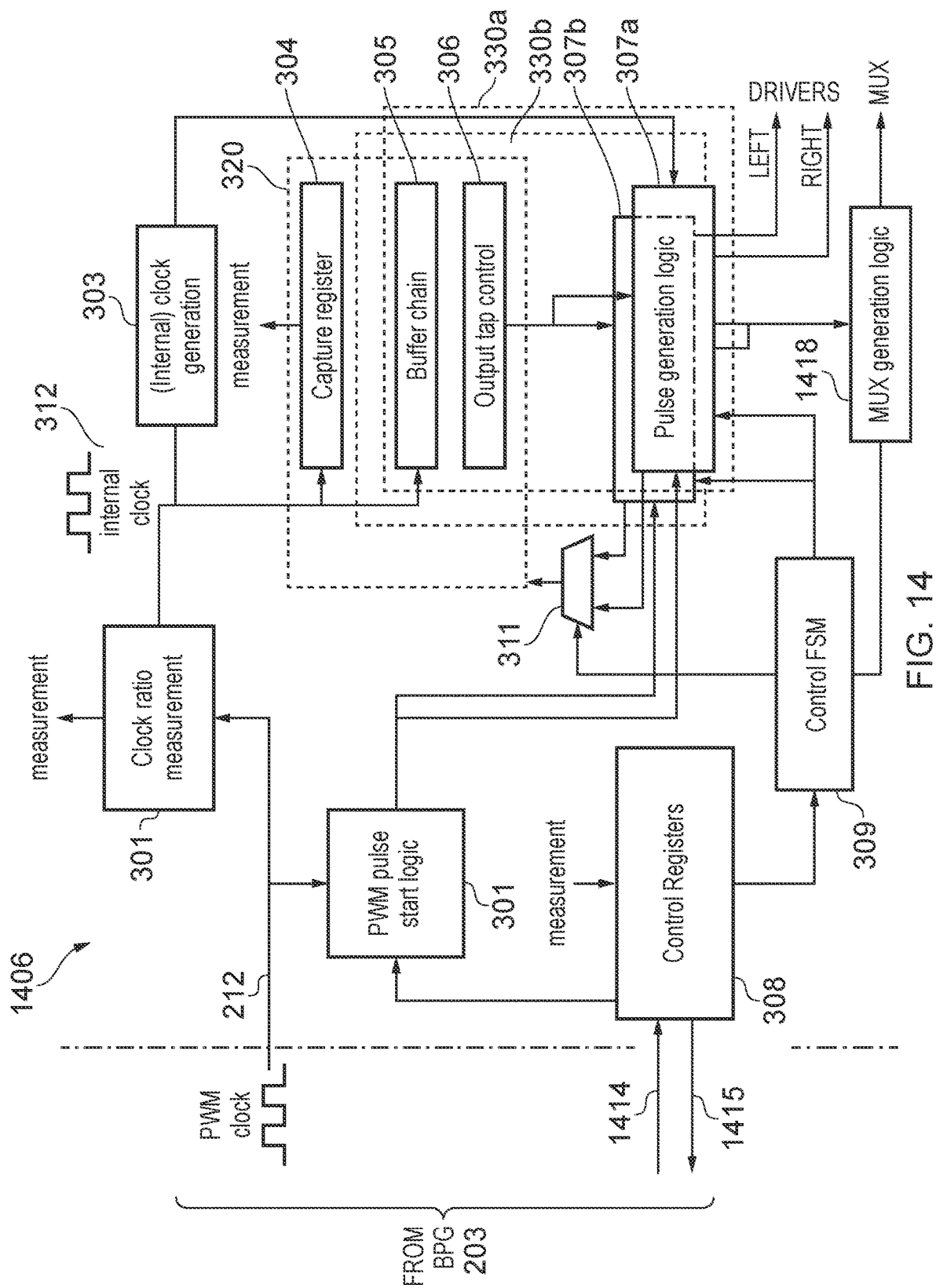
FIG. 14 illustrates a block diagram of PWM pulse generation configured for independent synthesis for each AC half-cycles, in accordance with one or more embodiments of the present disclosure.

Consider now, in more detail, FIG. 14. This figure shows a signal synthesiser 1406 according to embodiments of the present invention, and is illustrative of methods according to embodiments of the present invention. Parts of the system are similar or the same as those shown above with respect to FIG. 3. In particular, a PWM clock and data generation element 201 may be similar to or the same as that shown in FIG. 2 and the BPG block 203 the same or similar to that shown in FIG. 3, and thus the PWM clock signal 213 transferred from the BPG 203 may be the same as that in FIG. 3. Furthermore, the first and second measurements, transferred at 1415 from the signal synthesiser 1406 to the BPG block 203, may be the same as those 215 described above with reference to FIG. 3, and the set of pulse data 1414 may by the same as that, 214, described above with reference to FIG. 3.

In contrast to the circuit shown in FIG. 3, according to embodiments of the present invention, the circuit includes two copies of the pulse generation logic, 307a and 307b. One copy of pulse generation logic, 307a, is configured for use for the positive half cycle of the AC signal; the other pulse generation logic, 307b, is configured for use for the negative half cycle of the AC signal. Each pulse generation logic 307a, and 307b, is associated with a different one of the left-side driver 207 and the right-side driver 209. As shown the left-side may outputs from pulse generation logic 307a, and the right-side may outputs for pulse generation logic 307b. The control finite state machine 309 may include a MUX generation logic 1418 to drive a "half-cycle" selection output (indicating which half-cycle is current, as shown in 1111 in FIG. 11). The MUX generation output is also connected to the pulse generation logic 307a and 307b to enable a synchronization with the actual PWM start pulse derived from the output of the PWM pulse start logic 301. The circuit shown in FIG. 14 differs from that shown in FIG. 3 in that the output from the PWM pulse start logic 301 is directed to each of the pulse generation logics 307a and 307b.

Whereas in FIG. 3, a single pulse synthesis circuit 330 is shown including pulse generation logic 307, in embodiments of the present invention at least part of the pulse synthesis circuit 330a for use with the positive half-cycle of the AC signal is separate from at least part of the pulse synthesis circuit 330b for use with the negative half cycle day signals. However, the remaining parts of the pulse synthesis circuits may be in common. The pulse synthesis circuits may use the same propagation delay circuitry 320, and in particular they may use the same set of propagation delay elements 305 and may use the same output tap control 306. Re-use of the same circuitry for these units and in particular sharing the buffer chain and the measurement element may be beneficial because otherwise many other elements must be replicated as well. The control logic (which typically forms part of the control FSM 309) manages the usage of these shared components between the copies of the pulse generation logic 307a and 307b and the provision of related control data (e.g. the intra-clock control data), as shown at 311. This selection may be implemented using a multiplexer or otherwise.

By using separate copies of the pulse generation logic, 307a and 307b, an additional "degree of freedom" may be provided which, as discussed above, may be useful for avoiding spurious zero crossings when switching between the positive half cycle and negative half cycle (and vice versa). Again, as mentioned above, this may be implemented by allowing the timing of the pulse generation logic 307b to the offset relative to the timing of pulse generation logic 307a, while specifying the actual switching between the half-cycles by the half-cycle selection output MUX. The offset may be introduced by allowing independent control or delay of the pulse generation logic by one or more clock pulses of the internal free running clock 312 as an extension of the pulse synthesis control data 1414 (when compared to the corresponding control data 214 for the circuitry shown in FIG. 3).

From reading the present disclosure, other variations and modifications will be apparent to the skilled person. Such variations and modifications may involve equivalent and other features which are already known in the art of wireless charging, and which may be used instead of, or in addition to, features already described herein.

Generally, the term "element" is used herein to indicate a function or block which may advantageously, though not necessarily, be implemented by software, conversely, "circuit", "circuitry" and "unit" is used herein to indicate a function or block which may advantageously, though not necessarily, be implemented by hardware.

Although the appended claims are directed to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention.

It is noted that one or more embodiments above have been described with reference to different subject-matters. In particular, some embodiments may have been described with reference to method-type claims whereas other embodiments may have been described with reference to apparatus-type claims. However, a person skilled in the art will gather from the above that, unless otherwise indicated, in addition to any combination of features belonging to one type of subject-matter also any combination of features relating to different subject-matters, in particular a combination of features of the method-type claims and features of the apparatus-type claims, is considered to be disclosed with this document.

Features which are described in the context of separate embodiments may also be provided in combination in a single embodiment. Conversely, various features which are, for brevity, described in the context of a single embodiment, may also be provided separately or in any suitable sub-combination.

For the sake of completeness it is also stated that the term "comprising" does not exclude other elements or steps, the term "a" or "an" does not exclude a plurality, a single processor or other unit may fulfil the functions of several means recited in the claims [delete if not relevant] and reference signs in the claims shall not be construed as limiting the scope of the claims. Furthermore, the word "may" is used in a permissive sense (i.e., meaning having the potential to), rather than the mandatory sense (i.e., meaning must). Similarly, the words "include," "including," and "includes" mean including, but not limited to.

The invention claimed is:

1. A system configured for generating an AC signal having a positive half-cycle and a negative half-cycle, each comprising a plurality of pulse width modulated, PWM, pulses each with an individually designated pulse width, the system comprising:
    a first clock circuit configured to provide a first clock signal having a first frequency;
    a second clock circuit configured to generate a second clock signal having a second frequency, wherein the second frequency is greater than the first frequency;
    clock ratio measurement circuitry configured to output a first measurement for determining a ratio of the second frequency to the first frequency;
    a propagation delay circuit comprising a plurality of propagation delay elements and configured to output a second measurement indicative of a number of propagation delay elements through which a bit transition propagates within a single cycle of the second clock signal;
    a pulse data calculation element configured to determine pulse shaping data from the first and second measurements and the individually designated pulse widths; and,
    for each of the positive half-cycle and the negative half-cycle, a respective pulse synthesis circuit configured to synthesise the respective plurality of PWM pulses, each PWM pulse of each of the plurality of PWM pulses having a respective start defined by the first clock signal, and a respective pulse width defined by the pulse shaping data and synthesised from the second clock signal and a respective output pulse from the propagation delay circuit.

2. The system of claim 1, wherein a start of the plurality of PWM pulses of at least one of the positive and negative half-cycles is adjustable.

3. The system of claim 1, further comprising a multiplex select signal which defines a start and an end of each half-cycle.

4. The system of claim 3, wherein the respective pulse synthesis circuitry of at least one of the positive and negative half-cycles is configured such that at least one of:
    a start of the plurality of PWM pulses of that half-cycles precedes the start of the respective half-cycle, and
    the plurality of PWM pulses of that half-cycle extends beyond an end of the respective half-cycle.

5. The system of claim 1, wherein each respective pulse synthesis circuit comprises respective pulse generation logic configured to synthesise the pulse width for each respective PWM pulse of the respective plurality of PWM pulses from a respective predetermined calculated number of cycles of the second clock signal, together with the respective output pulse from the propagation delay circuit.

6. The system of claim 5, wherein the propagation delay circuit further comprises an output tap control circuit configured to output the respective output pulse from the propagation delay circuit, and each respective synthesis circuit comprises a same plurality of propagation delay elements and the output tap control circuit.

7. The system of claim 5, wherein the pulse data calculation element is configured to calculate the respective calculated number of the propagation elements and the respective predetermined calculated number of cycles of the second clock signal, together required to synthesise the respective pulse width.

8. The system of claim 1, wherein the propagation delay circuit is configured to generate the respective output pulse from the propagation delay circuit by bit transitions through a respective calculated number of the propagation delay elements.

9. The system of claim 1, at least one of:
    further comprising a pulse start logic circuit, connected to the first clock signal and configured to control the respective start of each PWM pulse of each of the plurality of PWM pulses;
    further comprising a plurality of control registers configured to store pulse shaping data for a group of pulses; and
    wherein the group of pulses consists of each of the pulses of a one of the respective plurality of PWM pulses.

10. The system of claim 1, wherein the clock ratio measurement circuitry is configured to count an integer number of second clock periods over a predetermined second integer number, greater than one, of first clock periods and the ratio is the first integer number divided by the second integer number.

11. The system of claim 1, wherein the first clock circuit is further configured to adjust the first frequency in response to a data-transfer request.

12. A method of generating an AC signal, having a positive half-cycle and a negative half-cycle, each having a respective start-moment and comprising a plurality of pulse width modulated, PWM, pulses each having a respective individually designated pulse width, the method comprising:

for each of the positive half-cycle and the negative half-cycle:
determining a pulse width for a specified PWM pulse to be generated;
determining a first measurement of a ratio between a PWM clock signal frequency and a second clock signal frequency;
configuring a bit transition to propagate through a propagation delay circuit and determining a second measurement of a number of propagation delay elements through which the bit transition propagates within a single a cycle of the second clock signal;
determining pulse shaping data comprising a first number of cycles of the second clock signal and a second number of the propagation delay elements to be utilised together to produce the pulse width for the specified PWM pulse as a function of the first measurement and the second measurement;
and utilising the determined first number of cycles of the second clock signal and the determined second number of propagation delay elements to synthesise the specified PWM pulse;

the method further comprising providing a timing offset between a start of a first PWM pulse in the positive half-cycle relative to a start-moment of the positive half-cycle, and a start of a first PWM pulse in the negative half-cycle relative to a start-moment of the negative half-cycle.

13. The method of claim 12, further comprising, by means of a finite state machine, selecting a respective different pulse generation logic for each of the positive half-cycle and the negative half-cycle.

14. The method of claim 12, further comprising adjusting the first frequency of the PWM clock signal in response to a data-transfer request.

15. The method of claim 12, wherein for each of the positive half-cycle and the negative half cycle, the determined first number of cycles of the second clock signal and the determined second number propagation delay elements are used in a respective pulse generation logic circuit to synthesise the specified PWM pulse.

* * * * *